(12) United States Patent
Chen et al.

(10) Patent No.: US 12,310,077 B2
(45) Date of Patent: May 20, 2025

(54) DUAL DAMASCENE STRUCTURE IN FORMING SOURCE/DRAIN CONTACTS

(71) Applicant: Taiwan Semiconductor Manufacturing Co., Ltd., Hsinchu (TW)

(72) Inventors: Chien-Han Chen, Nantou County (TW); Shih-Yu Chang, Yunlin County (TW); Chien-Chih Chiu, Xinying (TW); Huang-Ming Chen, Hsinchu (TW); Jyu-Horng Shieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 438 days.

(21) Appl. No.: 17/651,347

(22) Filed: Feb. 16, 2022

(65) Prior Publication Data

US 2023/0155001 A1 May 18, 2023

Related U.S. Application Data

(60) Provisional application No. 63/278,572, filed on Nov. 12, 2021.

(51) Int. Cl.
*H01L 29/66* (2006.01)
*H01L 21/768* (2006.01)
(Continued)

(52) U.S. Cl.
CPC ..... *H10D 64/017* (2025.01); *H01L 21/76807* (2013.01); *H01L 21/76831* (2013.01);
(Continued)

(58) Field of Classification Search
CPC ......... H01L 29/66545; H01L 21/76807; H01L 21/76831; H01L 21/76877;
(Continued)

(56) References Cited

U.S. PATENT DOCUMENTS

| 2003/0129827 A1* | 7/2003 | Lee ...................... C23C 16/401 |
| | | 257/E21.264 |
| 2008/0203450 A1 | 8/2008 | Naruse et al. |

(Continued)

FOREIGN PATENT DOCUMENTS

| KR | 20080078586 A | 8/2008 |
| KR | 20180002473 A | 1/2018 |

(Continued)

OTHER PUBLICATIONS

Wikipedia, "Dual Damascene Process," https://de.wikipedia.org/w/index.php?title=Dual-Damascene-Prozess, Oct. 10, 2024, 16 pages.

*Primary Examiner* — Tong-Ho Kim
(74) *Attorney, Agent, or Firm* — Slater Matsil, LLP

(57) ABSTRACT

A method includes forming a transistor comprising a source/drain region and a gate electrode, forming a source/drain contact plug over and electrically connecting to the source/drain region, forming a first inter-layer dielectric over the source/drain contact plug, forming an etch stop layer over the first inter-layer dielectric, etching the etch stop layer to form a first via opening, forming a second inter-layer dielectric over the first inter-layer dielectric, performing an etching process, so that the second inter-layer dielectric is etched to form a trench, and the first via opening in the etch stop layer is extended into the first inter-layer dielectric to reveal the source/drain contact plug, and filling the trench and the first via opening in common processes to form a metal line and a via, respectively.

20 Claims, 22 Drawing Sheets

(51) Int. Cl.
*H01L 21/8234* (2006.01)
*H01L 23/522* (2006.01)
*H01L 29/417* (2006.01)
*H10D 30/62* (2025.01)
*H10D 64/01* (2025.01)
*H10D 84/01* (2025.01)
*H10D 84/03* (2025.01)

(52) U.S. Cl.
CPC .. *H01L 21/76877* (2013.01); *H01L 21/76897* (2013.01); *H01L 23/5226* (2013.01); *H10D 30/6219* (2025.01); *H10D 84/0149* (2025.01); *H10D 84/038* (2025.01)

(58) Field of Classification Search
CPC ....... H01L 21/76897; H01L 21/823475; H01L 23/5226; H01L 29/41791; H01L 21/7681; H01L 23/53295; H01L 21/76895; H01L 29/165; H01L 29/7848; H01L 21/823431; H01L 21/76832; H01L 27/0886; H01L 21/76834; H01L 23/485; H01L 23/5283
USPC ........................................................ 257/211
See application file for complete search history.

(56) References Cited

U.S. PATENT DOCUMENTS

| | | | |
|---|---|---|---|
| 2013/0043539 | A1* | 2/2013 | Chang ............ H01L 21/823871 257/E21.409 |
| 2014/0061941 | A1 | 3/2014 | Gotou |
| 2017/0221891 | A1* | 8/2017 | Chen ................. H01L 21/76895 |
| 2017/0372948 | A1* | 12/2017 | Chou ................ H01L 21/76835 |
| 2018/0005876 | A1 | 1/2018 | Tung et al. |
| 2018/0096935 | A1 | 4/2018 | Kim et al. |
| 2019/0088542 | A1 | 3/2019 | Hsieh et al. |
| 2019/0164813 | A1 | 5/2019 | Wang et al. |
| 2021/0098366 | A1 | 4/2021 | Chang et al. |
| 2021/0249519 | A1 | 8/2021 | Yao et al. |

FOREIGN PATENT DOCUMENTS

| | | |
|---|---|---|
| KR | 20180037662 A | 4/2018 |
| KR | 20180131346 A | 12/2018 |
| KR | 20190064376 A | 6/2019 |
| KR | 20210038824 A | 4/2021 |

* cited by examiner ated U.S. Patent Application No. 63/278,572,
DUAL DAMASCENE STRUCTURE IN FORMING SOURCE/DRAIN CONTACTS

PRIORITY CLAIM AND CROSS-REFERENCE

This application claims the benefit of the following provisionally filed U.S. Patent Application No. 63/278,572, filed on Nov. 12, 2021, and entitled "M0-VD Dual-Damascene Design to Lower the Resistance of Device by VD on ESL (VOE) Approach," which application is hereby incorporated herein by reference.

BACKGROUND

Metal-Oxide-Semiconductor (MOS) devices are basic building elements in integrated circuits. Recent development of the MOS devices includes forming replacement gates, which include high-k gate dielectrics and metal gate electrodes over the high-k gate dielectrics. The formation of a replacement gate typically involves depositing a high-k gate dielectric layer and metal layers over the high-k gate dielectric layer, and then performing Chemical Mechanical Polish (CMP) to remove excess portions of the high-k gate dielectric layer and the metal layers. The remaining portions of the metal layers form the metal gates. The metal gates may be recessed to form recesses between neighboring gate spacers, followed by forming self-aligned dielectric hard masks in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
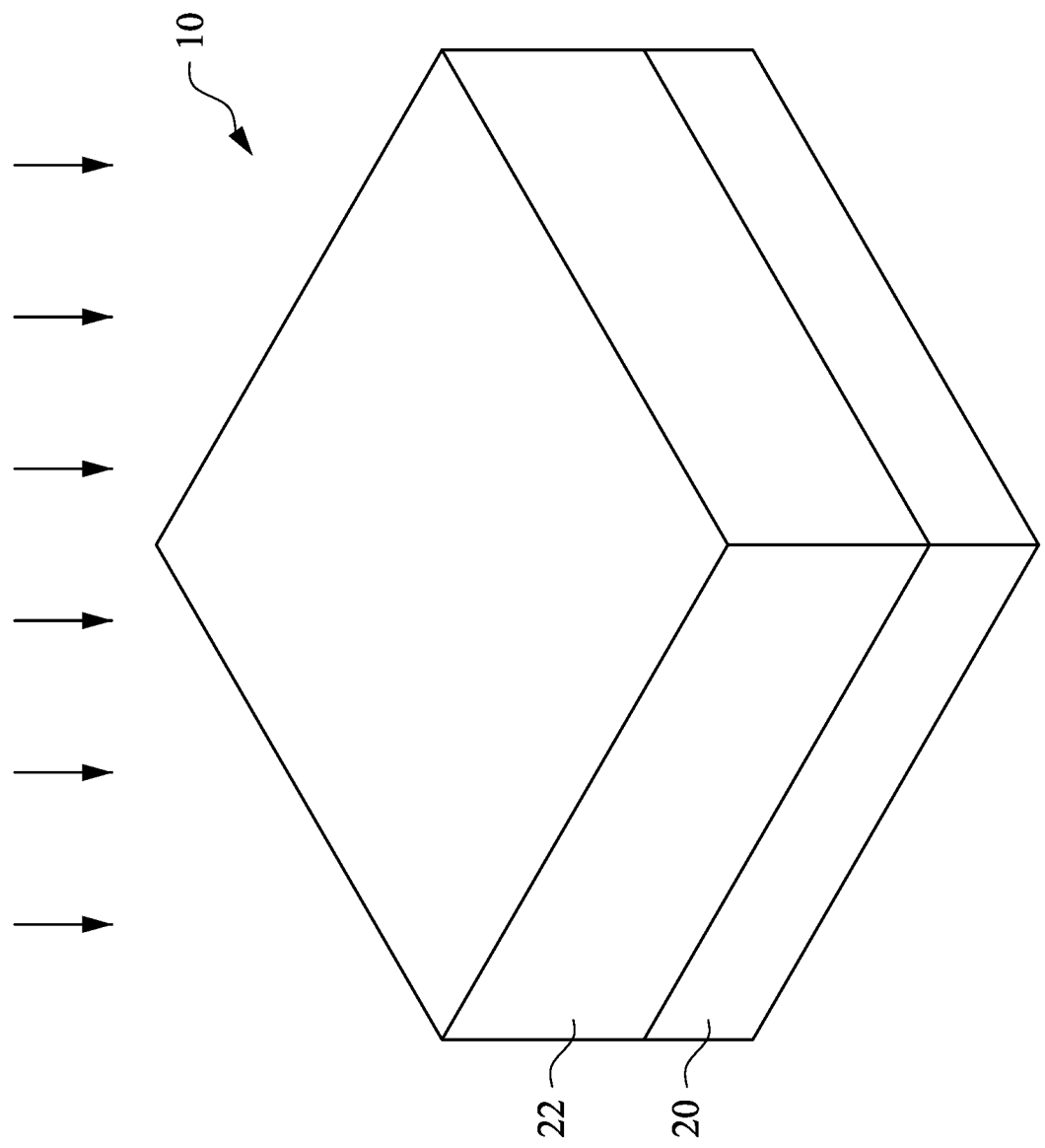
FIGS. 1-6, 7A, 7B, and 8-20 illustrate the perspective views and cross-sectional views of intermediate stages in the formation of Fin Field-Effect Transistors (FinFETs), contact plugs, and vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs), contact plugs, and vias, and the method of forming the same are provided. In accordance with some embodiments, FinFETs are formed, which include source/drain regions and gate stacks. Lower-level source/drain contact plugs and source/drain silicide regions are formed over the source/drain regions. Gate contact plugs are also formed over and connected to gate stacks. A dual-damascene process is performed to form metal lines and vias, wherein the vias are connected to the lower source/drain contact plugs, and act as upper source/drain contact plugs. The vias in the dual-damascene structure also extend into the same Inter-Layer Dielectric (ILD) as the gate contact plugs. By forming upper source/drain contact plugs and their overlaying metal lines (referred to as M0 metal lines hereinafter) as dual-damascene structures, the interface therebetween are removed, and contact resistance values are reduced. Furthermore, copper may be used to replace the otherwise tungsten, and the resistance is further reduced.

Although FinFETs are used to describe example embodiments, the embodiments of the present application may also be applied to other types of transistors such as Gate-All-Around (GAA) transistors and planar transistors. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-6, 7A, 7B, and 8-20 illustrate the cross-sectional views and perspective views of intermediate stages in the formation of Fin Field-Effect Transistors (FinFETs) in accordance with some embodiments. The processes shown in these figures are also reflected schematically in the process flow 200 as shown in FIG. 21.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In accordance with some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 as shown in FIG. 21. In accordance with some embodiments, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
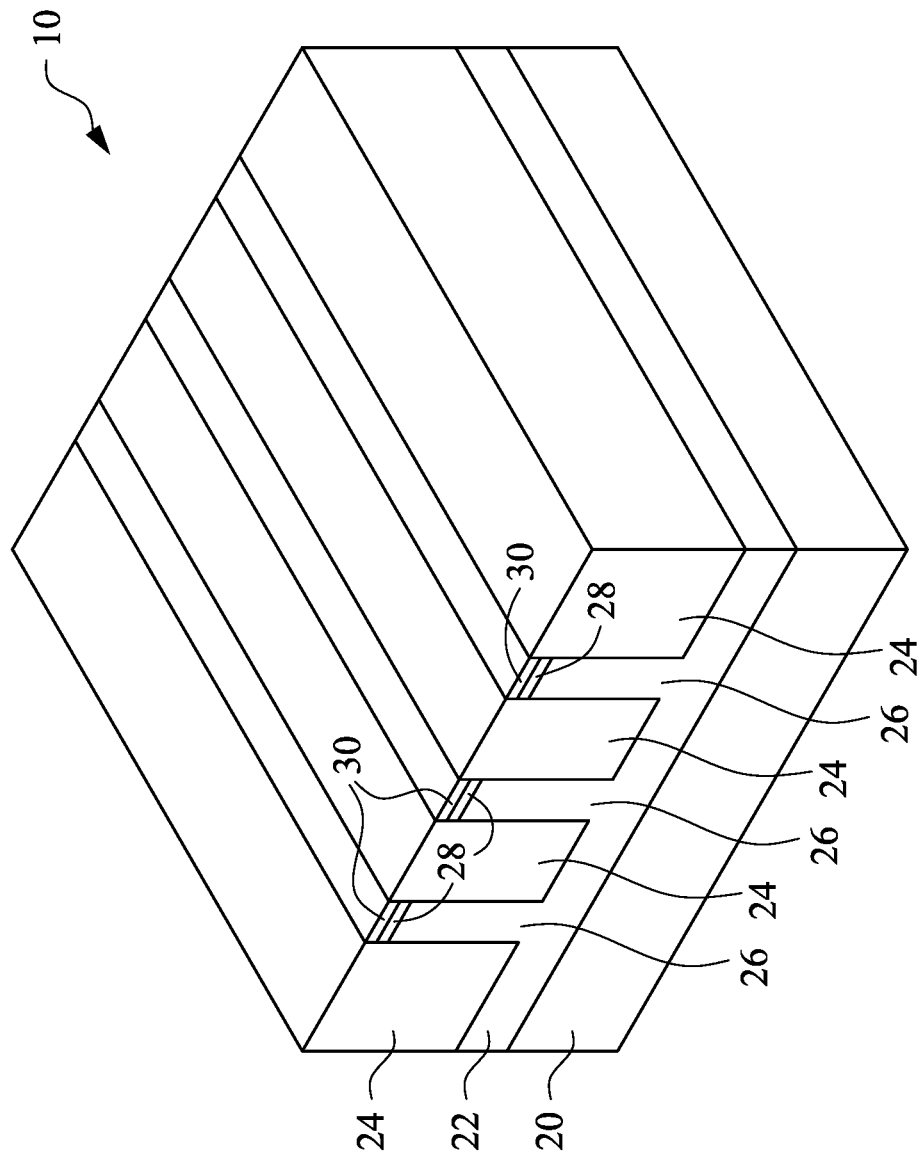

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 21. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments, hard mask layer 30 is formed of silicon nitride, for example, using Low-Pressure Chemical Vapor Deposition (LPCVD). In accordance with other embodiments of the present disclosure, hard mask layer 30 is formed through thermal nitriding of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layers 30 are used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
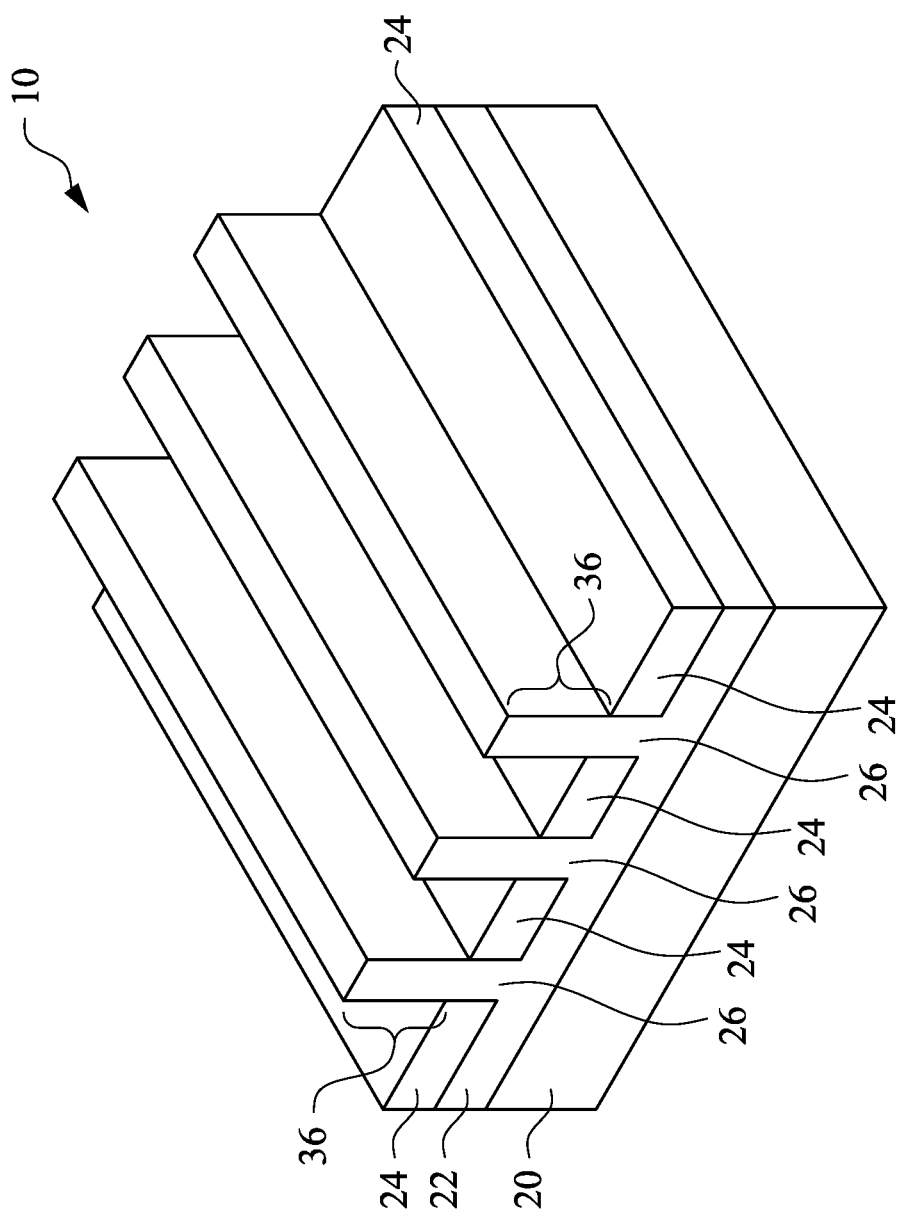

Referring to FIG. 3, STI regions 24 are recessed, so that the top portions of semiconductor strips 26 protrude higher than the top surfaces 24T of the remaining portions of STI regions 24 to form protruding fins 36. The respective process is illustrated as process 206 in the process flow 200 as shown in FIG. 21. The etching may be performed using a dry etching process, wherein the mixture of HF and NH$_3$, for example, is used as the etching gas. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
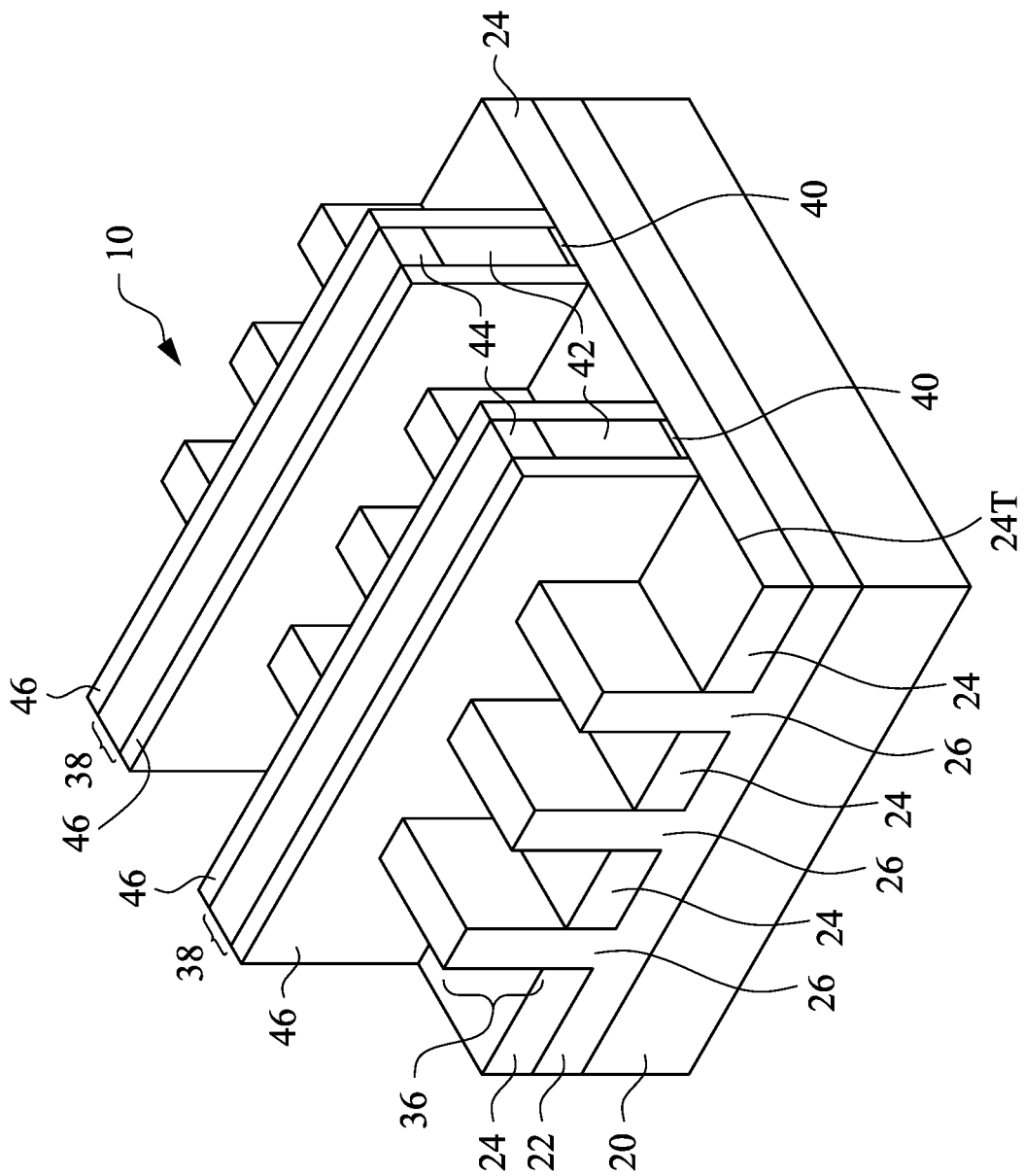

Referring to FIG. 4, dummy gate stacks 38 are formed to extend on the top surfaces and the sidewalls of (protruding) fins 36. The respective process is illustrated as process 208 in the process flow 200 as shown in FIG. 21. Dummy gate stacks 38 may include dummy gate dielectrics 40 (shown in FIG. 7B) and dummy gate electrodes 42 over dummy gate dielectrics 40. Dummy gate electrodes 42 may be formed, for example, using polysilicon or amorphous silicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 as shown in FIG. 21. In accordance with some embodiments, gate spacers 46 are formed of a dielectric material(s) such as silicon nitride, silicon carbo-nitride, or the like, and may have a single-layer structure or a multi-layer structure including a plurality of dielectric layers.

Figure 5:
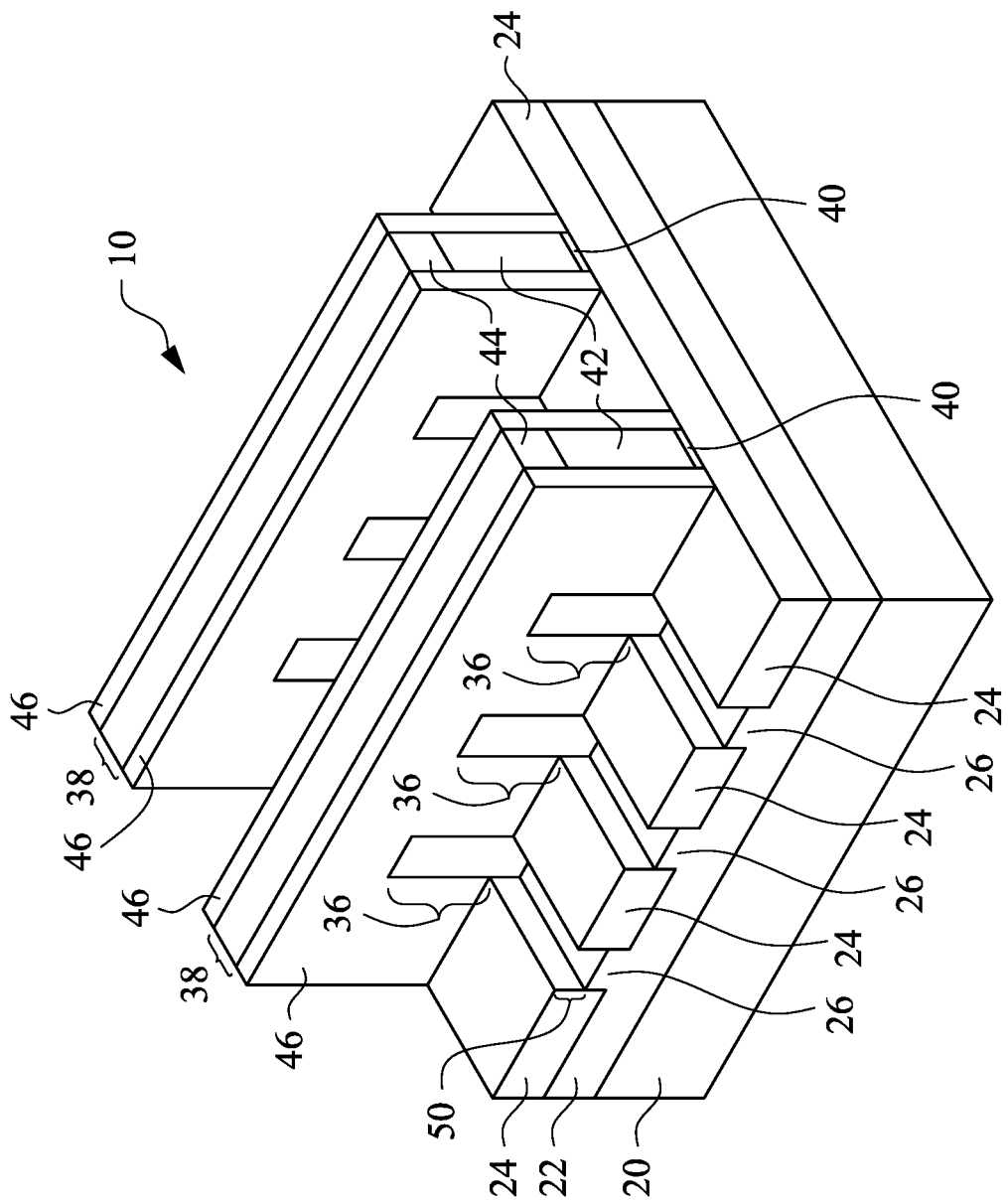

The portions of protruding fins 36 that are not covered by dummy gate stacks 38 and gate spacers 46 are then etched, resulting in the structure shown in FIG. 5. The respective process is illustrated as process 210 in the process flow 200 as shown in FIG. 21. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24T of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
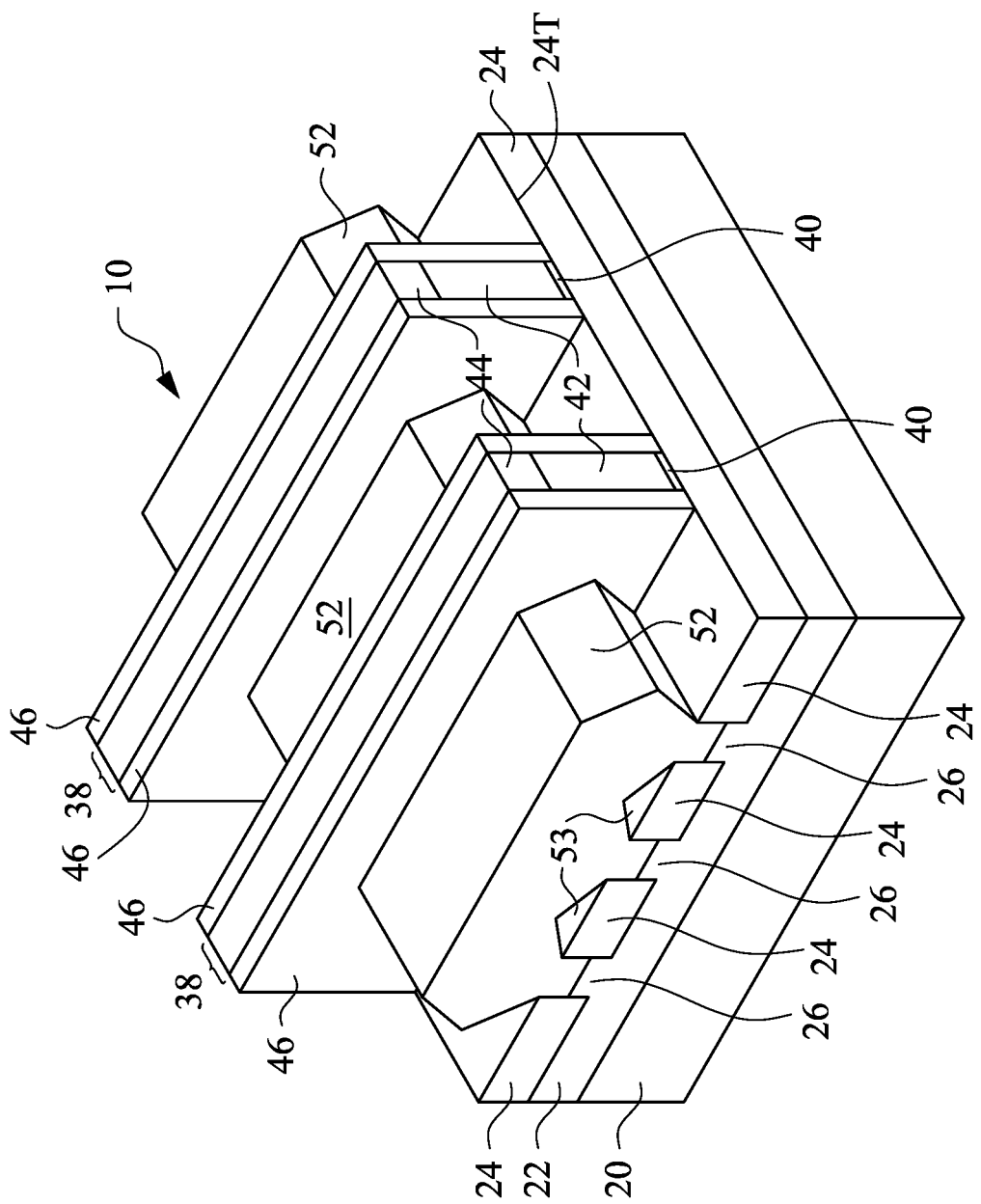

Next, epitaxy regions (source/drain regions) 52 are formed by selectively growing (through epitaxy) a semiconductor material in recesses 50, resulting in the structure in FIG. 6. The respective process is illustrated as process 212 in the process flow 200 as shown in FIG. 21. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 52 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 52, the further epitaxial growth of epitaxy regions 52 causes epitaxy regions 52 to expand horizontally, and facets may be formed. The further growth of epitaxy regions 52 may also cause neighboring epitaxy regions 52 to merge with each other. Voids (air gaps) 53 may be generated.

Figure 7A:
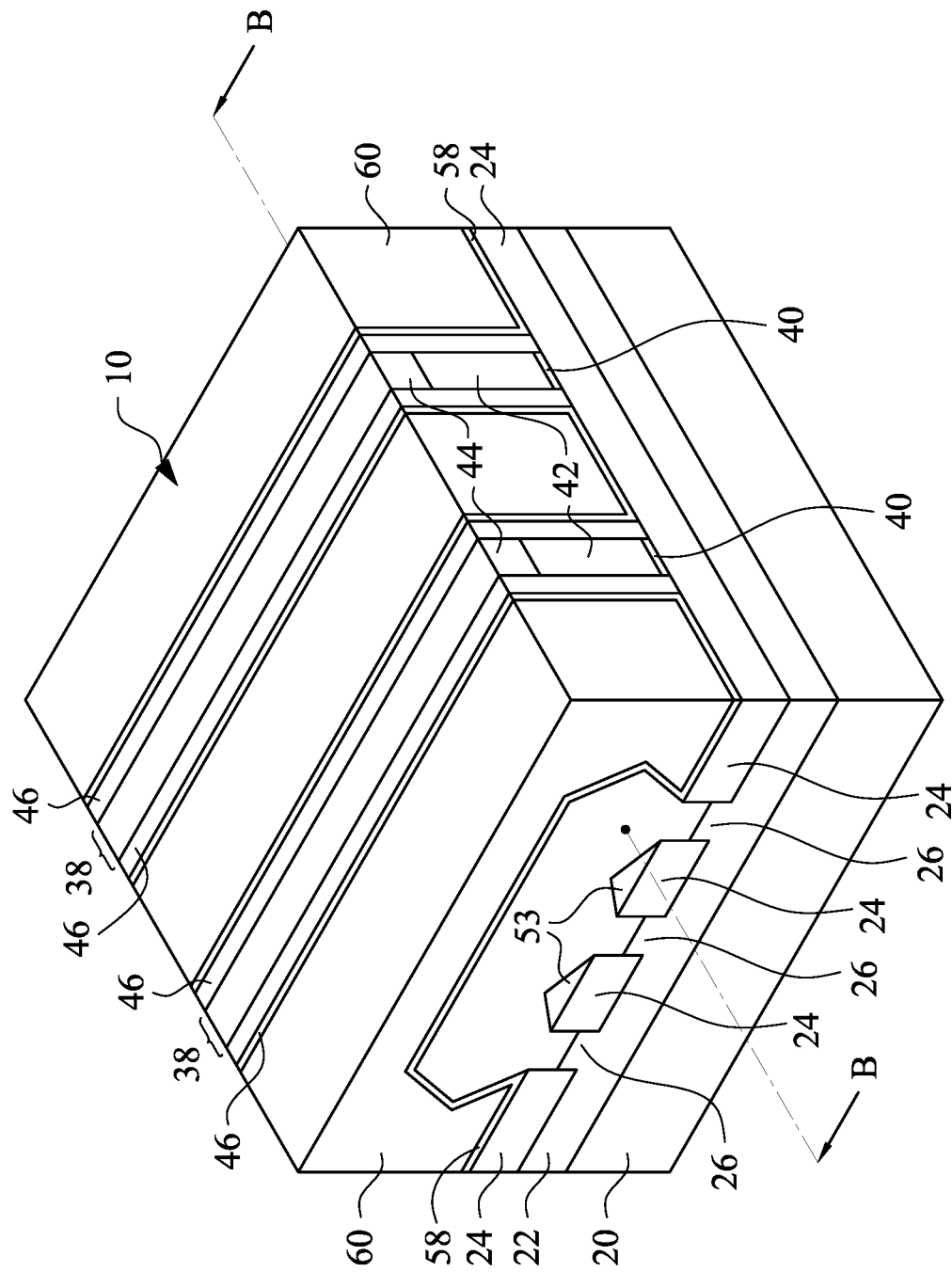

FIG. 7A illustrates a perspective view of the structure after the formation of Contact Etch Stop Layer (CESL) 58 and Inter-Layer Dielectric (ILD) 60. The respective process is illustrated as process 214 in the process flow 200 as shown in FIG. 21. CESL 58 may be formed of silicon oxide, silicon nitride, silicon carbo-nitride, aluminum oxide, aluminum nitride, or the like, and may be formed using CVD, ALD, or the like. ILD 60 may include a dielectric material formed using, for example, PECVD, FCVD, spin-on coating, CVD, or another deposition method. In accordance with some embodiments, the deposition of ILD 60 is performed with plasma, for example, when PECVD is used. ILD 60 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
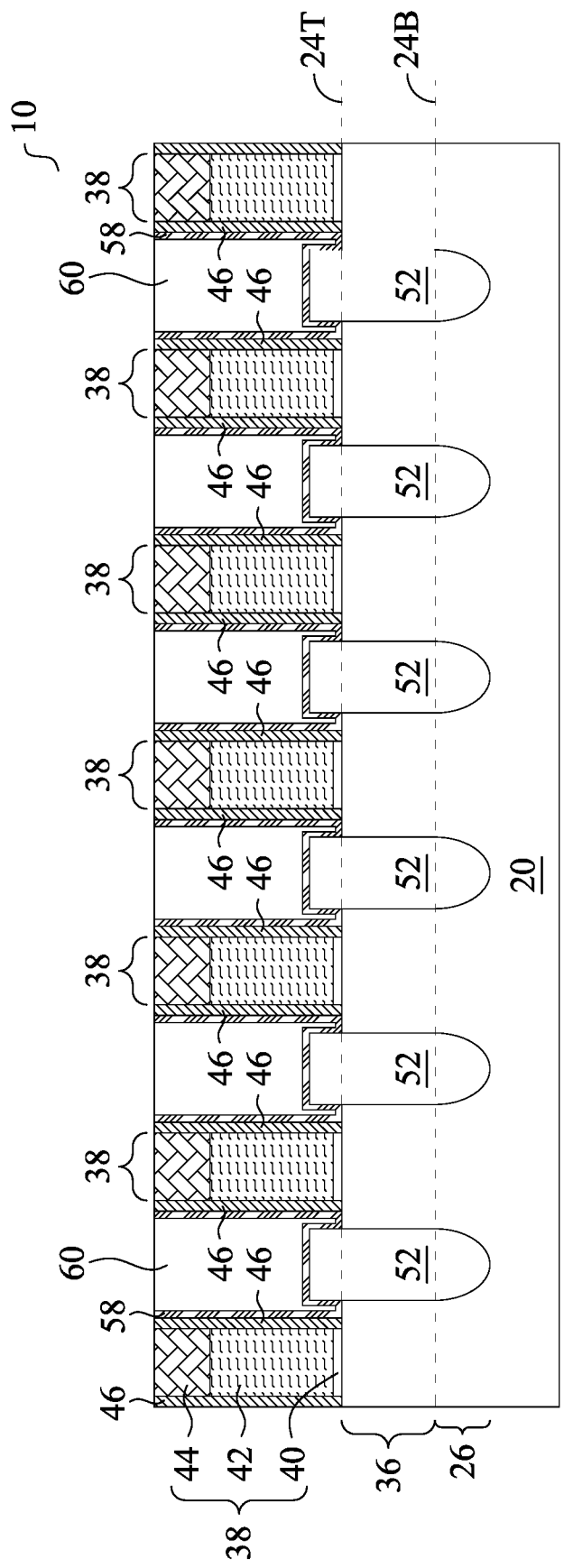

FIG. 7B illustrates a vertical plane in the reference cross-section B-B of the structure in FIG. 7A. A plurality of epitaxy regions 52 and a plurality of dummy gate stacks 38 are shown, which may belong to a plurality of FinFETs. In FIG. 7B and subsequent figures, the level of the top surfaces 24T and bottom surfaces 24B of STI regions 24 are illustrated. STI regions 24 are not in the illustrated cross-section in FIGS. 7B and 8-20, and hence are not shown. Semiconductor fins 36 are the portions of semiconductor strips 26 higher than top surface level 24T.

Figure 8:
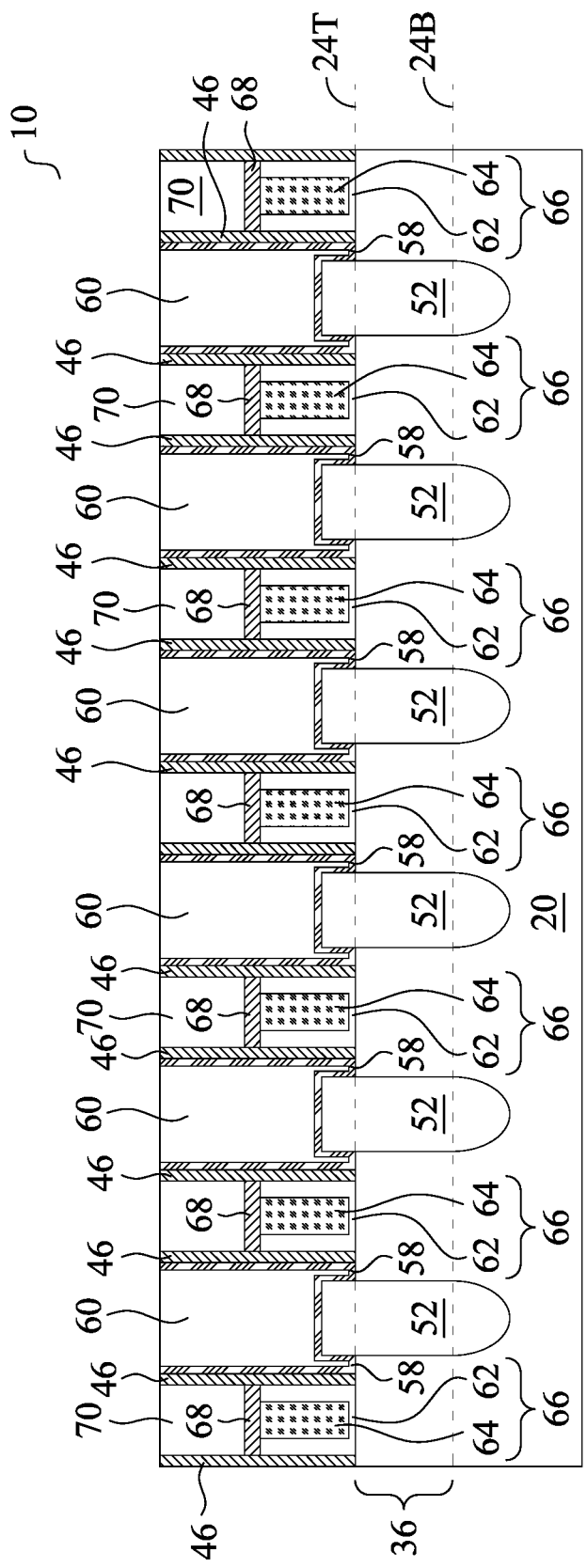

After the structure shown in FIGS. 7A and 7B is formed, dummy gate stacks 38 are replaced with replacement gate stacks 66, which include replacement gate dielectrics 62 and replacement gate electrodes 64, as shown in FIG. 8. The respective process is illustrated as process 216 in the process flow 200 as shown in FIG. 21. When replacing gate stacks, hard mask layers 44, dummy gate electrodes 42, and dummy gate dielectrics 40 as shown in FIGS. 7A and 7B are first removed. Next, replacement gate stacks 66 are formed in the trenches left by the removed dummy gate stacks 38. The respective process is illustrated as process 216 in the process flow 200 as shown in FIG. 21.

In accordance with some embodiments, each of gate dielectrics 62 include an Interfacial Layer (IL) as its lower part. The ILs are formed on the exposed surfaces of protruding fins 36. Each IL may include an oxide layer such as a silicon oxide layer, which is formed through the thermal oxidation of the respective protruding fin 36, a chemical oxidation process, or a deposition process. Gate dielectrics 62 may also include high-k dielectric layers formed over the respective ILs. The high-k dielectric layers may be formed of or comprise a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. The high-k dielectric layers are formed as conformal layers extending on the sidewalls of protruding fins 36 and the top surfaces and the sidewalls of gate spacers 46. In accordance with some embodiments, the high-k dielectric layers are formed using ALD or CVD.

In accordance with some embodiments, gate electrodes 64 include stacked layers. The sub-layers in the stacked layers are not shown separately, while the sub-layers may be distinguishable from each other. The deposition may be performed using conformal deposition processes such as ALD, CVD, or the like, so that the thickness of the vertical portions and the thickness of the horizontal portions of the stacked layers (and each of sub-layers) are substantially equal to each other. The stacked layers, when deposited, extend into the trenches left by the removed dummy gate stacks 38, and include some portions over ILD 60.

The stacked layers may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a conductive capping layer, which may be another TiN layer, is formed.

Next, a metallic filling material is deposited, which may be formed of or comprises tungsten or cobalt, for example. The filling material fully fills the trenches left by the removed dummy gate stacks 38. Gate dielectrics 62 and gate electrodes 64, at the time they are deposited, include some portions extending into the trench left by the removed dummy gate stacks 38, and other portions over ILD 60. In a subsequent process, a planarization step such as a CMP process or a mechanical grinding process is performed, so that the portions of the deposited layers over ILD 60 are removed. As a result, metal gate electrodes 64 are formed.

Replacement gate dielectrics 62 and replacement gate electrodes 64 are in combination referred to as replacement gate stacks 66 hereinafter.

In accordance with some embodiments, as shown in FIG. 8, the replacement gate stacks 66 are recessed, followed by a selective deposition of metal layers 68 on the respective gate electrodes 64. Metal layers 68 have lower resistivity than at least some (or all) of the materials in replacement gate stacks 66, and may help to reduce resistance. In accordance with alternative embodiments, the formation of metal layers 68 is skipped.

FIG. 8 further illustrates the formation of self-aligned hard masks 70. In accordance with some embodiments, self-aligned hard masks 70 are formed of a material free from oxygen, and may be formed of or comprise silicon nitride (SiN), silicon carbide (SiC), silicon carbo-nitride (SiCN), or the like. Self-aligned hard masks 70 may be deposited using CVD, ALD, PECVD, PVD, or the like.

Figure 9:
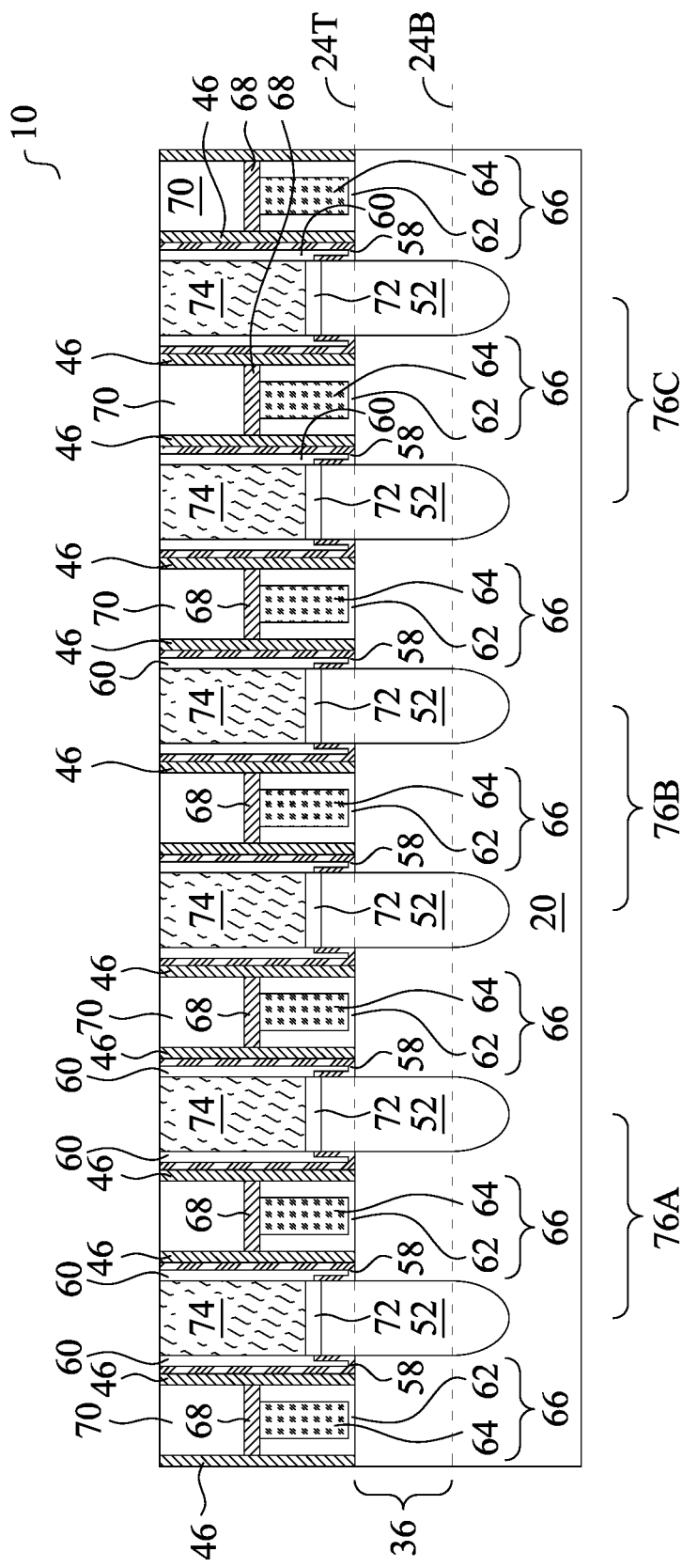

FIG. 9 illustrates the formation of source/drain contact plugs 74, which are also referred to as lower source/drain contact plugs. Source/drain silicide regions 72 are formed through silicidation process, wherein a metal layer (such as a titanium layer or a cobalt layer) is used to react with a respective underlying epitaxy region 52 to form a silicide layer. Each of source/drain contact plugs 74 may include a barrier layer, which may be a metal nitride layer such as a titanium nitride layer or a tantalum nitride layer. Source/drain contact plugs 74 may further include a metallic material over the barrier layer. The metallic material may be formed of or comprises tungsten, cobalt, aluminum, or the like, or alloys thereof. A planarization process such as a CMP process or a mechanical grinding process is then performed to remove the portions of the metal layer, the barrier layer, and the metallic material, with the remaining portions of these layers forming source/drain contact plugs 74. FinFETs 76, which may include FinFET 76A, FinFET 76B, and FinFET 76C, are thus formed.

Figure 10:
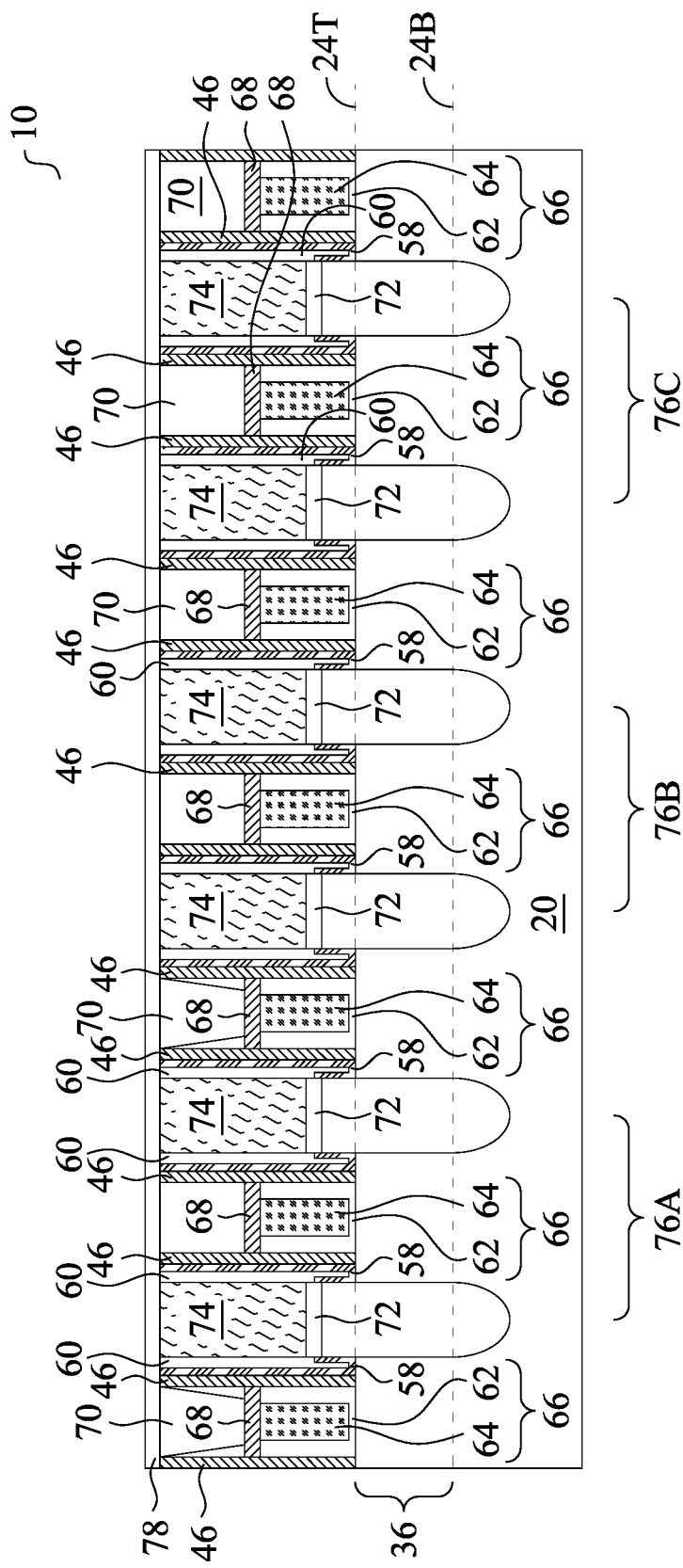

In accordance with some embodiments, as shown in FIG. 10, isolation layer 78 is deposited. The respective process is illustrated as process 220 in the process flow 200 as shown in FIG. 21. It is appreciated that isolation layer 78 and the underlying structure is merely an example, and different structures may be formed, which are also in the scope of the present disclosure. For example, self-aligned hard masks 70 may not be formed, and isolation layer 78 may be formed as a conformal layer extending down to contact metal layers 68. In accordance with these embodiments, isolation layer 78 may be deposited as a conformal layer, or a near-conformal layer, for example with the thickness variation being less than 30 percent of the thickness of the thickest part, which is likely to be the horizontal part on the top surface of ILD 60.

Figure 11:
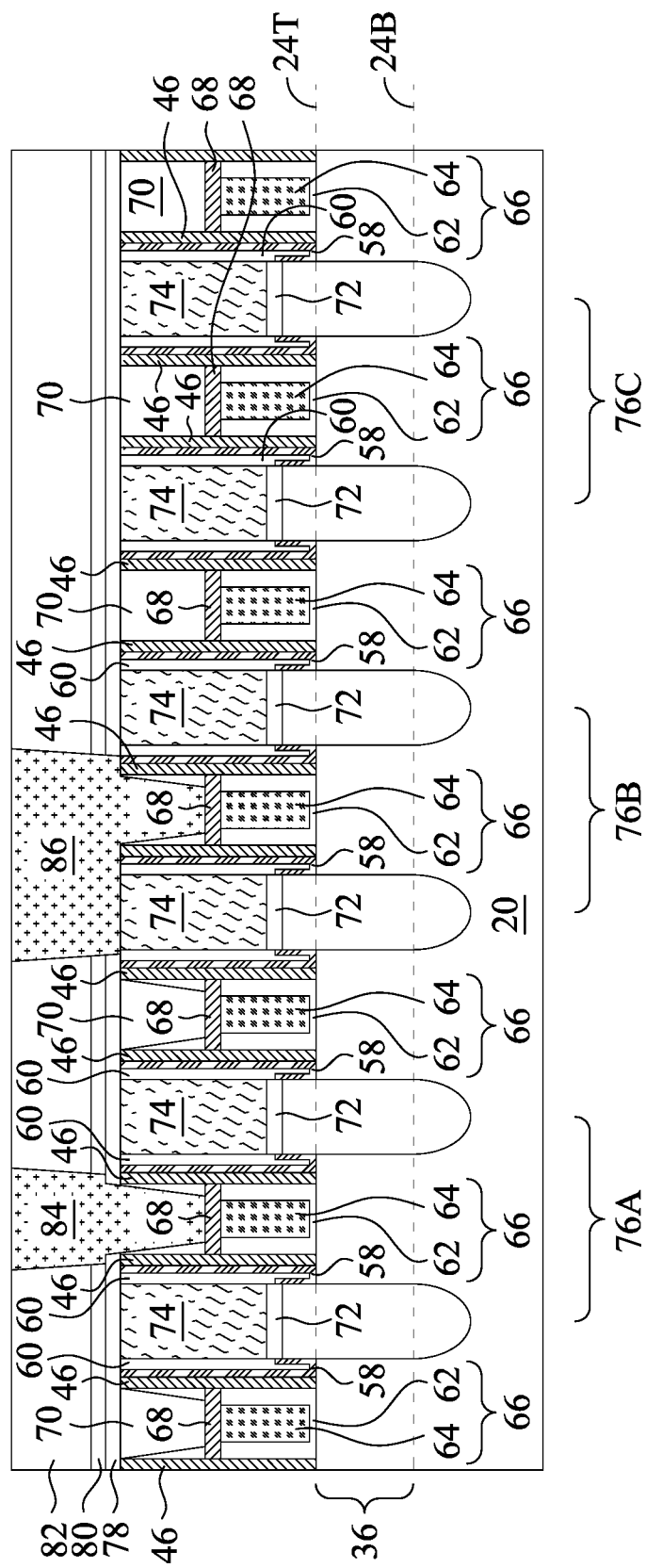

FIG. 11 illustrates the formation of etch stop layer (ESL) 80 and Inter-Layer Dielectric (ILD) 82. The respective process is illustrated as process 222 in the process flow 200 as shown in FIG. 21. Etch stop layer 80 may be formed of or comprise aluminum nitride, aluminum oxide, silicon nitride, silicon carbide, silicon oxynitride, silicon carbonitride, silicon oxy-carbo-nitride, or the like, or multi-layers thereof, and may be formed using a deposition method such as CVD, ALD, or the like. ILD 82 may include silicon oxide, phospho-silicate glass (PSG), borosilicate glass (BSG), boron-doped phospho-silicate glass (BPSG), fluorine-doped silicate glass (FSG), or the like. ILD 82 may be formed using spin-on coating, FCVD, or the like, or formed through a deposition process such as PECVD or LPCVD.

Next, gate contact plug 84 and butted contact 86 (which is also a gate contact plug) are formed. The respective process is illustrated as process 224 in the process flow 200 as shown in FIG. 21. Gate contact plug 84 penetrates through ILD 82, ESL 80, isolation layer 78, and self-aligned hard mask 70 to contact metal layer 68, and hence is electrically connected to the corresponding gate electrode 64. In accordance with some embodiments, gate contact plug 84 has substantially straight edges extending from the top surface of ILD 82 to metal layer 68. In accordance with alternative embodiments, gate contact plug 84 includes a wider portion and a narrow portion, with their edges forming a step. In accordance with these embodiments, isolation layer 78 may prevent gate contact plug 84 from bridging to the neighboring lower source/drain contact plugs 74, and may reduce leakage currents in between.

Body contact 86 is used to connect the source/drain contact plug 74 and the gate stack 66 of FinFET 76B. Gate contact plug 84 and body contact 86 may share some formation processes, while some other processes are different, so that the wider upper portion of body contact 86 also penetrates through isolation layer 78 to contact the source/drain contact plug 74 of FinFET 76B, while the wider upper portion of gate contact plug 84 stops on isolation layer 78.

In accordance with some embodiments, each of gate contact plug 84 and butted contact 86 comprises a conformal barrier layer, and a metallic material over the barrier layer. The barrier layer may be formed of or comprises TiN, TaN, Ti, Ta, or the like. The metallic material may be formed of or comprise tungsten, cobalt, aluminum, the alloys thereof, or the like. In accordance with alternative embodiments, gate contact plug 84 and butted contact 86 are barrier-less, and may be formed of or comprise a homogeneous material such as tungsten, cobalt, aluminum, or the alloys thereof.

Figure 12:
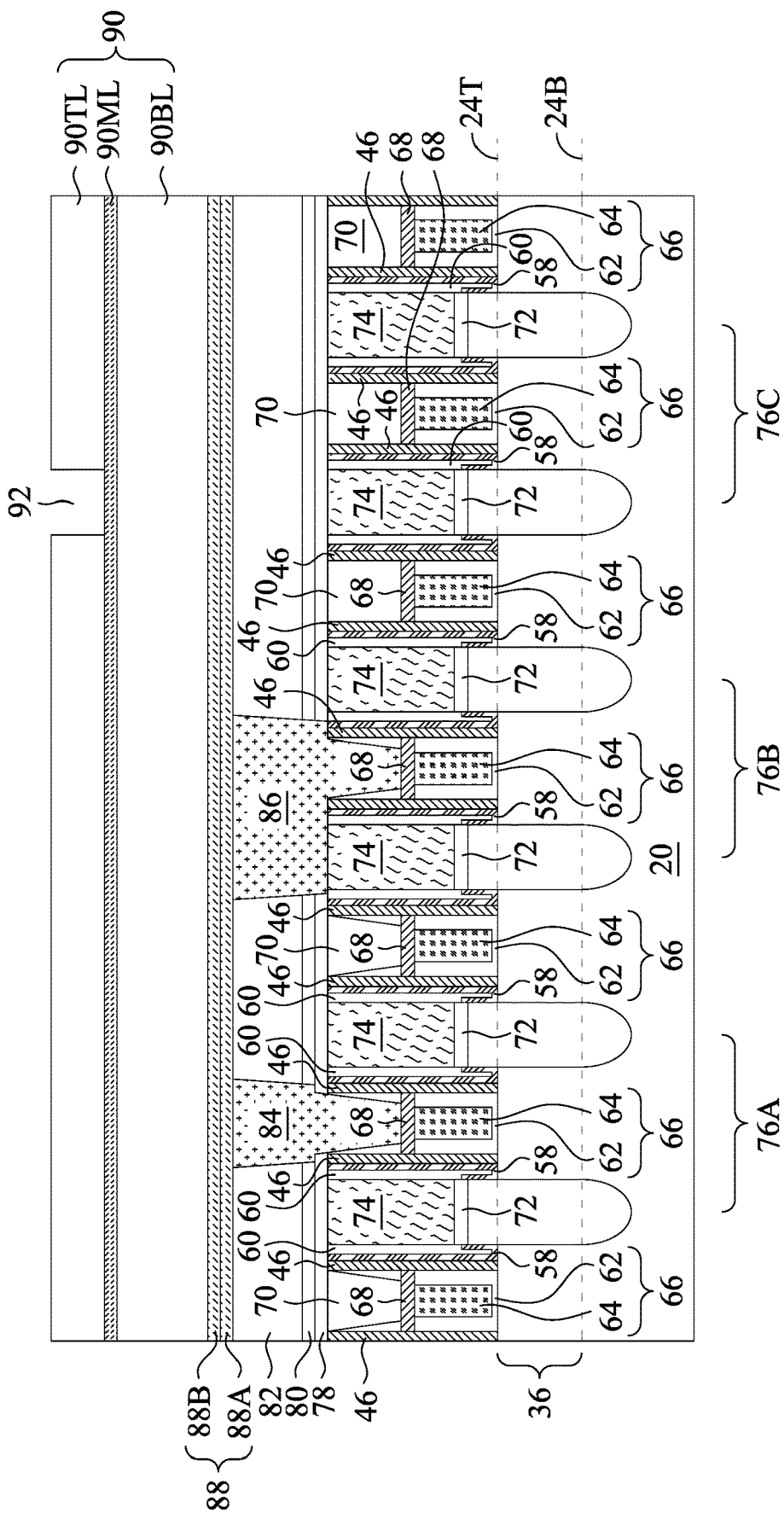

Referring to FIG. 12, ESL 88 is deposited. ESL 88 is a composite layer including two or more sub-layers, with the neighboring one of the sub-layers being formed of different materials. The sub-layers may be formed of or comprise a nitride, a silicon-carbon based material, a carbon-doped oxide, an oxygen-doped carbide, a metal-containing dielectric, or the like. In accordance with some embodiments, ESL 88 includes sub-layer 88A formed of or comprising aluminum oxide, and sub-layer 88B formed of or comprising SiOC. In accordance with alternative embodiments, ESL 88 includes sub-layer 88A formed of or comprising aluminum oxide, sub-layer 88B formed of or comprising SiOC, and an overlying sub-layer (not shown) formed of or comprising aluminum oxide. The upper sub-layer 88B may also be formed of silicon oxide, silicon nitride, or the like, while the lower sub-layer 88A may also be formed of other metal oxides such as zirconium oxide.

Figure 13:
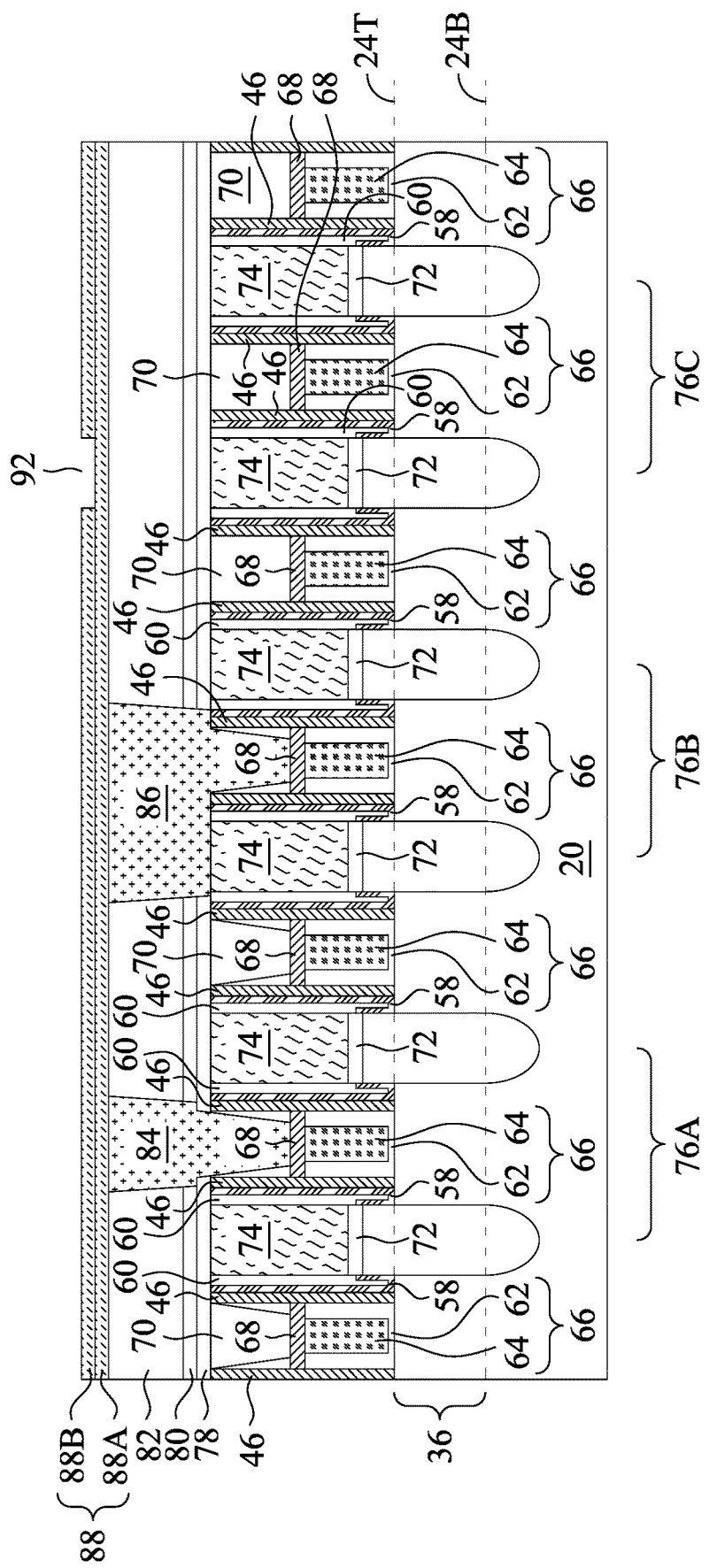

FIGS. 12 through 15 illustrate a double-patterning process to define the patterns for vias that are closely located to each other. FIGS. 12 and 13 illustrate the formation of a first via opening. The respective process is illustrated as process 226 in the process flow 200 as shown in FIG. 21. As shown in FIG. 12, etching mask 90, which may be a tri-layer, is formed. Etching mask 90 may include bottom layer 90BL (also sometimes referred to as an under layer), middle layer 90ML over bottom layer 90BL, and top layer 90TL (also sometimes referred to as an upper layer) over middle layer 90ML.

In accordance with some embodiments, bottom layer 90BL is formed of a carbon-containing material (through CVD), and top layer 90TL is formed of a photo resist (through spin coating), which may include organic or inorganic materials. Bottom layer 90BL may be a crystallized or cross-linked photoresist. Middle layer 90ML may be formed of a mixed inorganic silicon-containing material, which may be a nitride (such as silicon nitride), an oxynitride (such as silicon oxynitride), an oxide (such as silicon oxide), or the like. Middle layer 90ML may also be an inorganic film (such as silicon) deposited through CVD. Top layer 90TL is patterned to form opening 92, which is used to define a via opening in subsequent processes.

In subsequent processes, middle layer 90ML and bottom layer 90BL, and an upper sub-layer in ESL 88 are etched to extend opening 92 into the upper layer. Opening 92 stops on a lower sub-layer of ESL 88. In accordance with some embodiments in which ESL 88 includes two sub-layers 88A and 88B without more sub-layers, the upper sub-layer is layer 88B and the lower sub-layer is layer 88A. In accordance with other embodiments in which ESL 88 includes three or more sub-layers, the upper layer may be layer 88B or any other overlying-sub layer, and the lower layer may be the layer immediately under and contacting the upper layer. Etching mask 90 is then removed, and the resulting structure is shown in FIG. 13.

Figure 14:
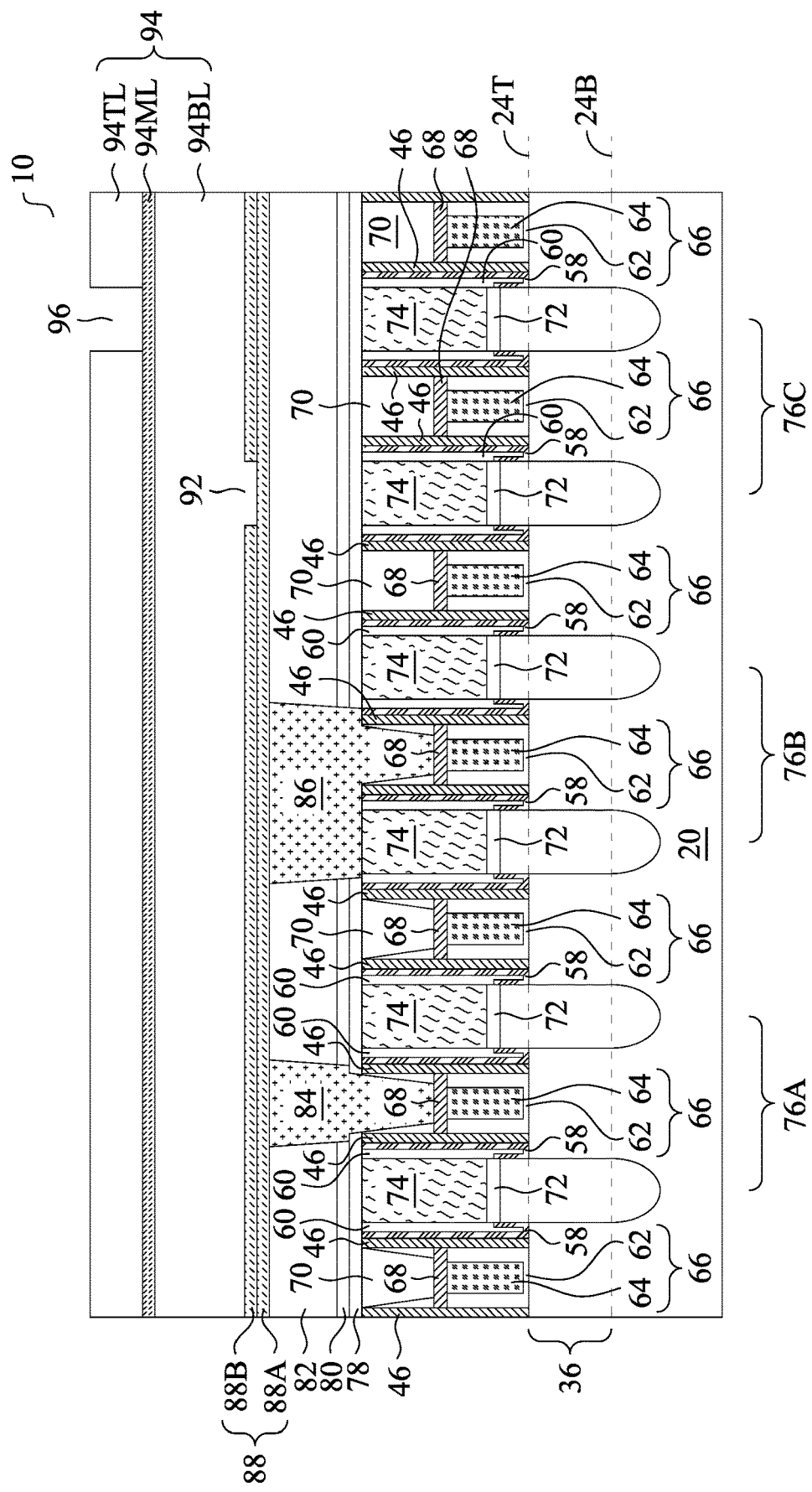
Figure 15:
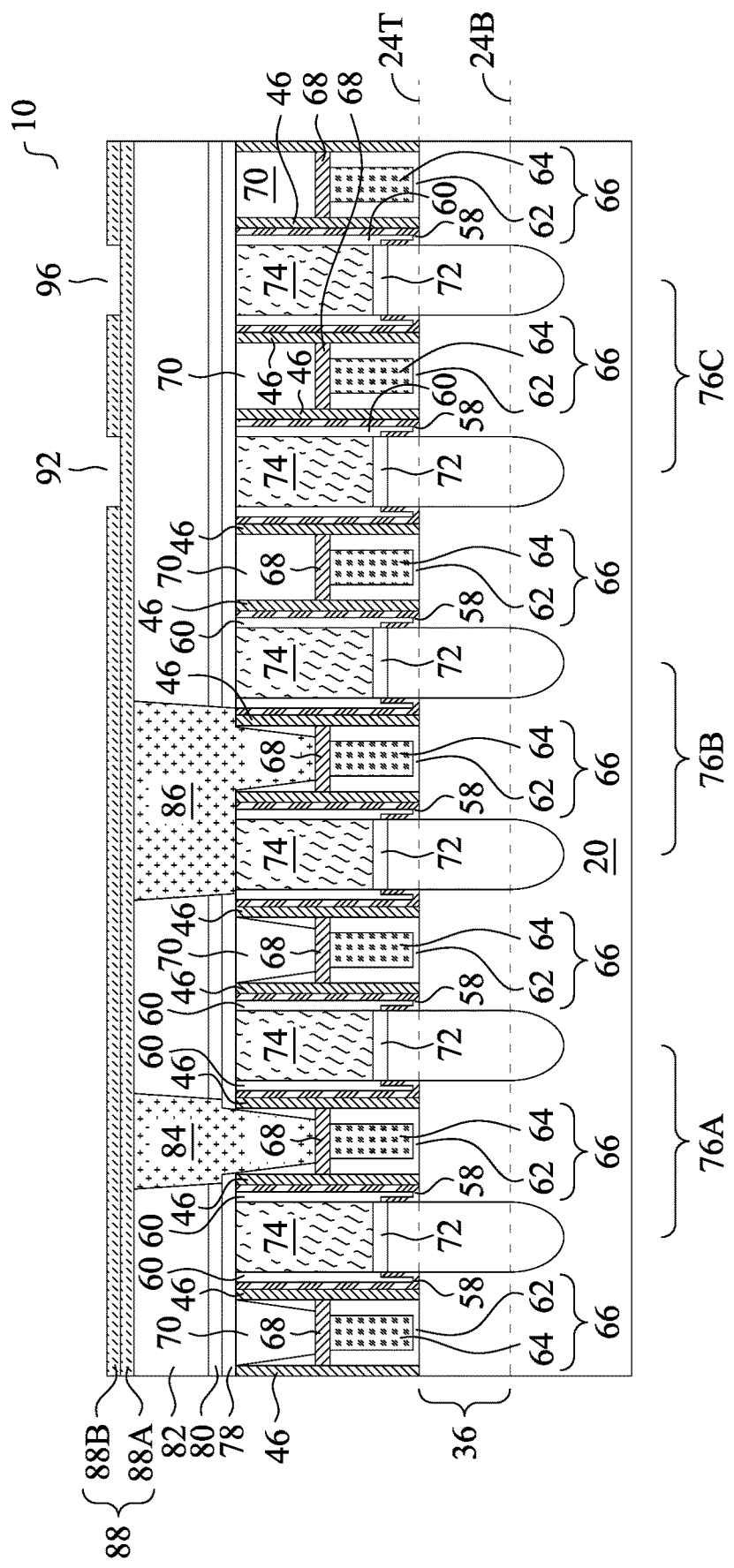

FIGS. 14 and 15 illustrate the formation of a second via opening in the double-patterning process. The respective process is illustrated as process 228 in the process flow 200 as shown in FIG. 21. The processes are similar to the processes shown in FIGS. 12 and 13. Referring to FIG. 14, etching mask 94 is formed, and includes bottom layer 94BL, middle layer 94ML, and top layer 94TL. The materials of bottom layer 94BL, middle layer 94ML, and top layer 94TL may be similar to the materials of bottom layer 90BL, middle layer 90ML, and top layer 90TL, respectively. Opening 96 is formed in top layer 94TL. Opening 96 is then extended down into the upper layer (such as sub-layer 88B) of ESL 88, and stops on the lower layer (such as sub-layer 88A) of ESL 88. Etching mask 94 is then removed. The resulting structure is shown in FIG. 15.

In the etching of upper sub-layer 88B and when sub-layer 88B comprises SiOC, an example etching process may be performed with plasma generated using a high-RF-frequency power in the range between about 200 watts and about 1,000 watts, and a low-RF-frequency power in the range between about 200 watts and about 500 watts. The pressure of the etching chamber may be in the range between about 20 mTorr and about 80 mTorr. The temperature of wafer 10 during the etching may be in the range between about 0° C. and about 50° C. An example etching gas may include a CxFy based gas having a flow rate in the range between about 20 sccm and about 50 sccm, nitrogen ($N_2$) having a flow rate lower than about 100 sccm, argon having a flow rate in the range between about 600 sccm and about 1,200 sccm, hydrogen ($H_2$) having a flow rate lower than about 100 sccm, and/or a CHxFy-based gas having a flow rate lower than about 100 sccm. A DC voltage may be applied on the top electrode of the etching tool to control C/F ratio, and the DC voltage may be smaller than about 500 volts.

Figure 16:
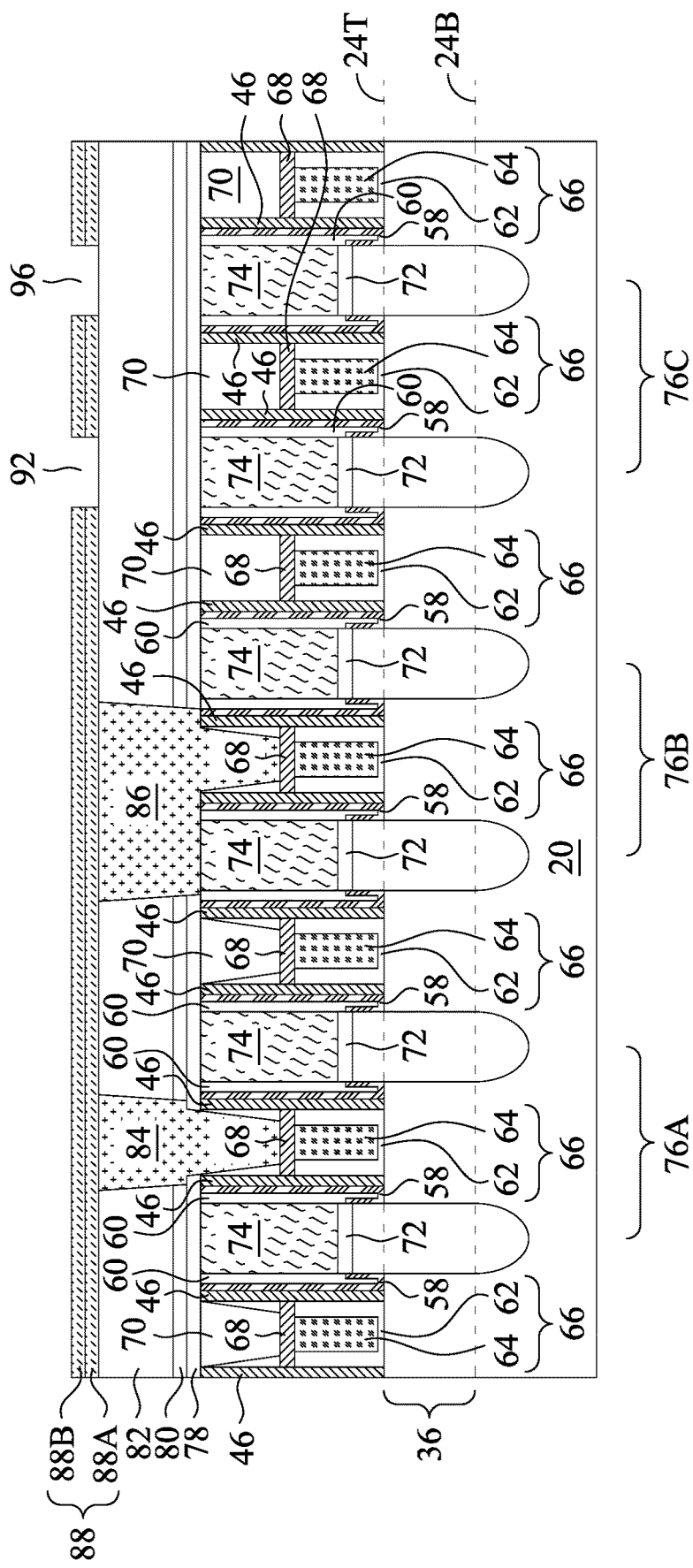

Referring to FIG. 16, an etching process is performed to etch-through the remaining layers (including the lower sub-layer such as 88A) of ESL 88. The respective process is illustrated as process 230 in the process flow 200 as shown in FIG. 21. The etching is stopped on the underlying ILD 82. In accordance with some embodiments in which lower sub-layer 88A comprises aluminum oxide, the etching may be performed using a chemical solution comprising $NH_4F$ dissolved in deionized water.

Figure 17:
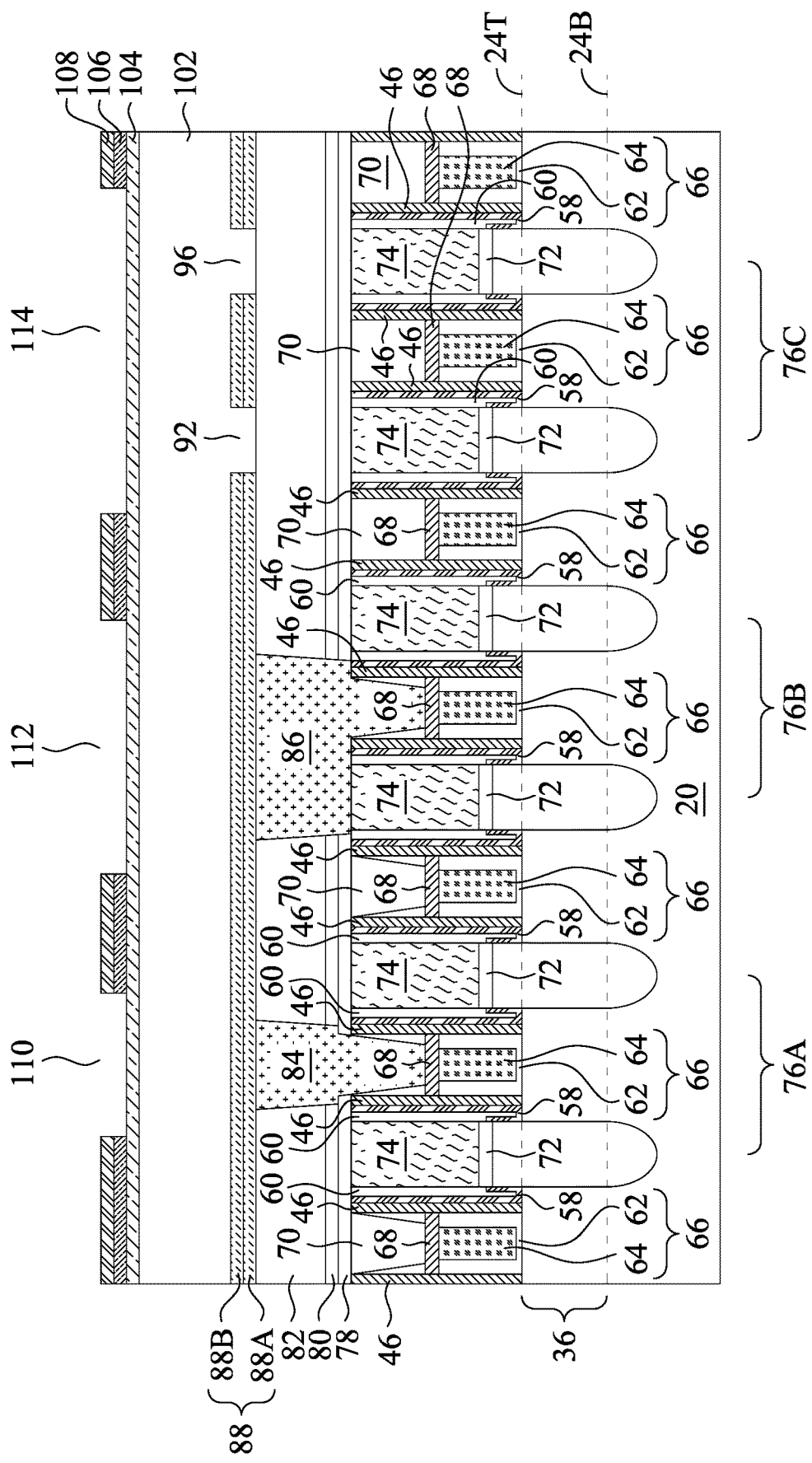

FIG. 17 illustrates the formation of dielectric layer 102 (also referred to as Inter-Metal Dielectric (IMD)). The respective process is illustrated as process 232 in the process flow 200 as shown in FIG. 21. Pad layer 104, hard mask 106, and buffer layer 108 are also deposited. The respective process is illustrated as process 234 in the process flow 200 as shown in FIG. 21. Trenches 110, 112, and 114 are formed in buffer layer 108 and hard mask 106. The formation of trenches 110, 112, and 114 may be similar to the process shown in FIGS. 14 and 15, for example, using a multi-layer hard mask. The formation process is not discussed in detail.

In accordance with some embodiments, dielectric layer 102 is formed of a low-k dielectric material having a dielectric constant (k-value) lower than about 3.0 or lower than about 3.5. Dielectric layer 102 may be formed of or comprise Black Diamond (a registered trademark of Applied Materials), a carbon-containing low-k dielectric material, Hydrogen SilsesQuioxane (HSQ), MethylsilsesQuioxane (MSQ), or the like. In accordance with some embodiments, the formation of dielectric layer 102 includes depositing a porogen-containing dielectric material, and then performing a curing process to drive out the porogen, and hence the remaining dielectric layer 102 is porous. Pad layer 104 and buffer layer 108 may be formed of or comprise silicon oxide, silicon oxycarbide, or the like. Hard mask 106 may be formed of or comprises a metal nitride such as titanium nitride, boron nitride, or the like, a metal oxide, or the like.

Trenches 110, 112, and 114 are formed in buffer layer 108 and hard mask 106. The formation may be performed by using a patterned etching mask (not shown), which may be similar to etching mask 94 (FIG. 14).

Next, the patterned hard mask 106 is used to etch the underlying pad layer 104 and dielectric layer 102. The respective process is illustrated as process 236 in the process flow 200 as shown in FIG. 21. The etching is anisotropic, and is stopped by the lower sub-layer 88A of etch stop layer 88. In accordance with some embodiments in which dielectric layer 102 comprises oxide, the etching may be performed using a carbon and fluorine containing (CxFy) gas such as $C_2F_6$, $CF_4$, $CH_2F_2$, or the like, or combinations thereof. Other gases such as fluorine ($F_2$), Chlorine ($Cl_2$), hydrogen chloride (HCl), hydrogen bromide (HBr), Bromine ($Br_2$), $SO_2$, the mixture of HBr, $Cl_2$, and $O_2$, or the mixture of HBr, $Cl_2$, $O_2$, and $CH_2F_2$ etc. may also be used.

Figure 18:
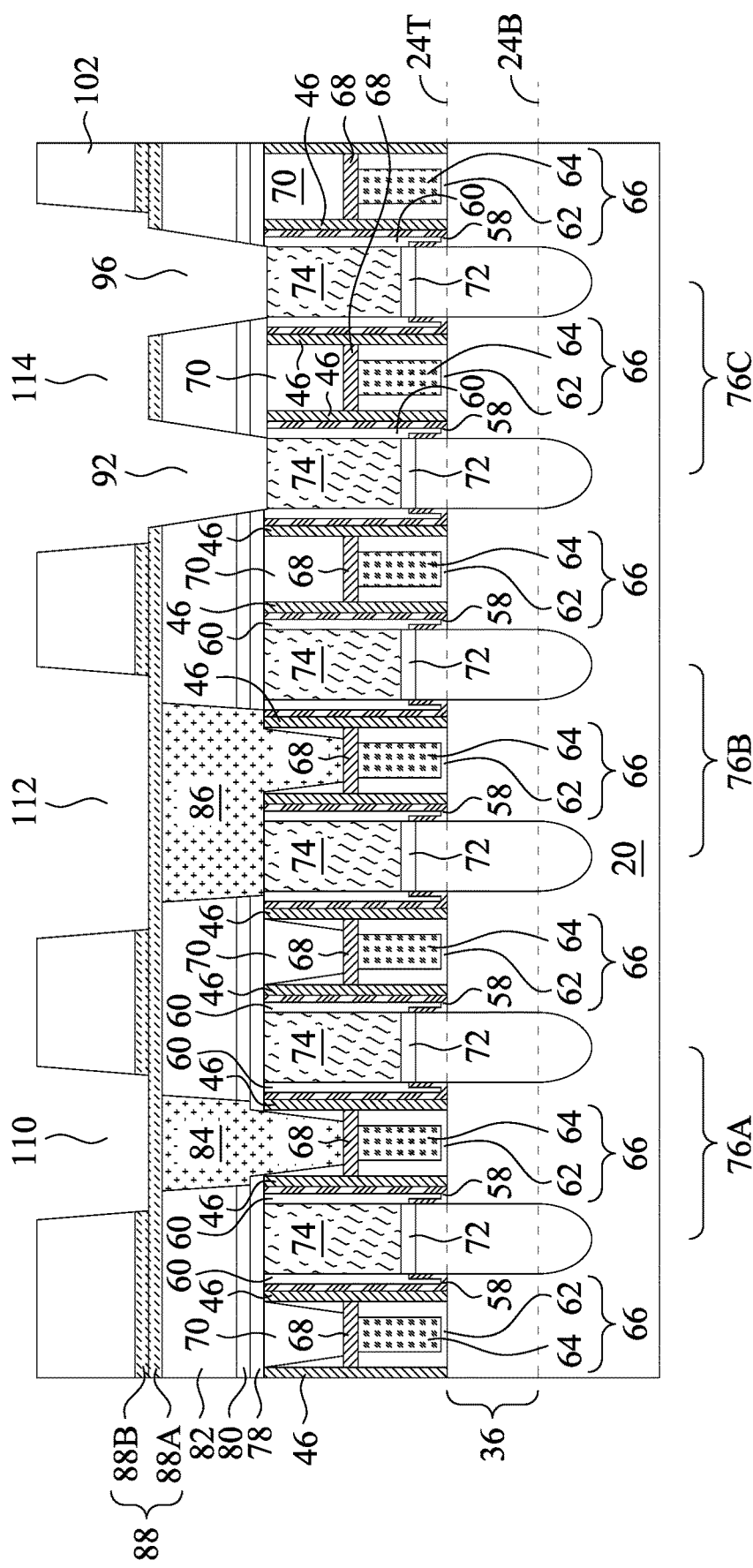

The etching may be performed with plasma generated using a high-RF-frequency power in the range between about 200 watts and about 1,000 watts, and a low-RF-frequency power in the range between about 200 watts and about 500 watts. The pressure in the etching chamber may be in the range between about 20 mTorr and about 80 mTorr. The temperature of wafer 10 during the etching may be in the range between about 0° C. and about 80° C. For example, an example etching gas may include a CxFy-based gas having a flow rate in the range between about 20 sccm and about 50 sccm, nitrogen ($N_2$) having a flow rate lower than about 100 sccm, argon having a flow rate in the range between about 600 sccm and about 1,200 sccm, hydrogen ($H_2$) having a flow rate lower than about 100 sccm, and/or a CHxFy-based gas having a flow rate lower than about 100 sccm. A DC voltage may be applied to control C/F ratio, and the DC voltage may be lower than about 500 voltages. After the etching process, the remaining pad layer 104, hard mask 106, and buffer layer 108 are removed, and the resulting structure is shown in FIG. 18, In the etching as shown in FIG. 18, the downward extension of trenches 110, 112, and 114 is stopped by sub-layer 88A of ESL 88. Under trench 114, on the other hand, via openings 92 and 96 have been formed in preceding paragraphs. Accordingly, ILD 82, etch stop layer 80, and isolation layer 78 are etched-through, so that the underlying source/drain contact plugs 74 are revealed to via openings 92 and 96.

Figure 19:
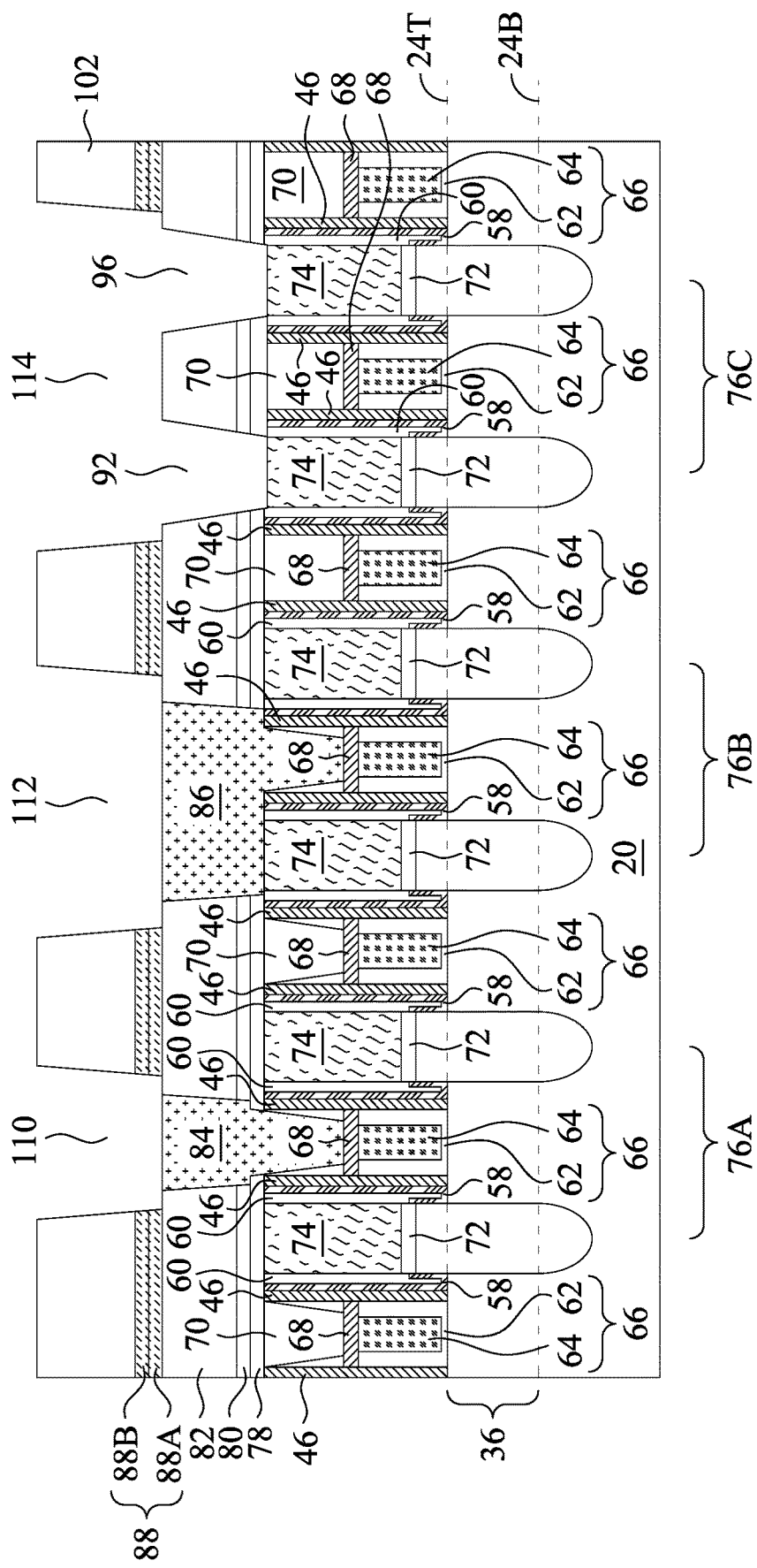

Referring to FIG. 19, an additional etching process is performed to etch the sub-layer 88A of ESL 88. The etching may be anisotropic or isotropic, and may be dry or wet. As a result, gate contact plug 84 and butted contact 86 are also revealed to trenches 110 and 112, respectively.

Figure 20:
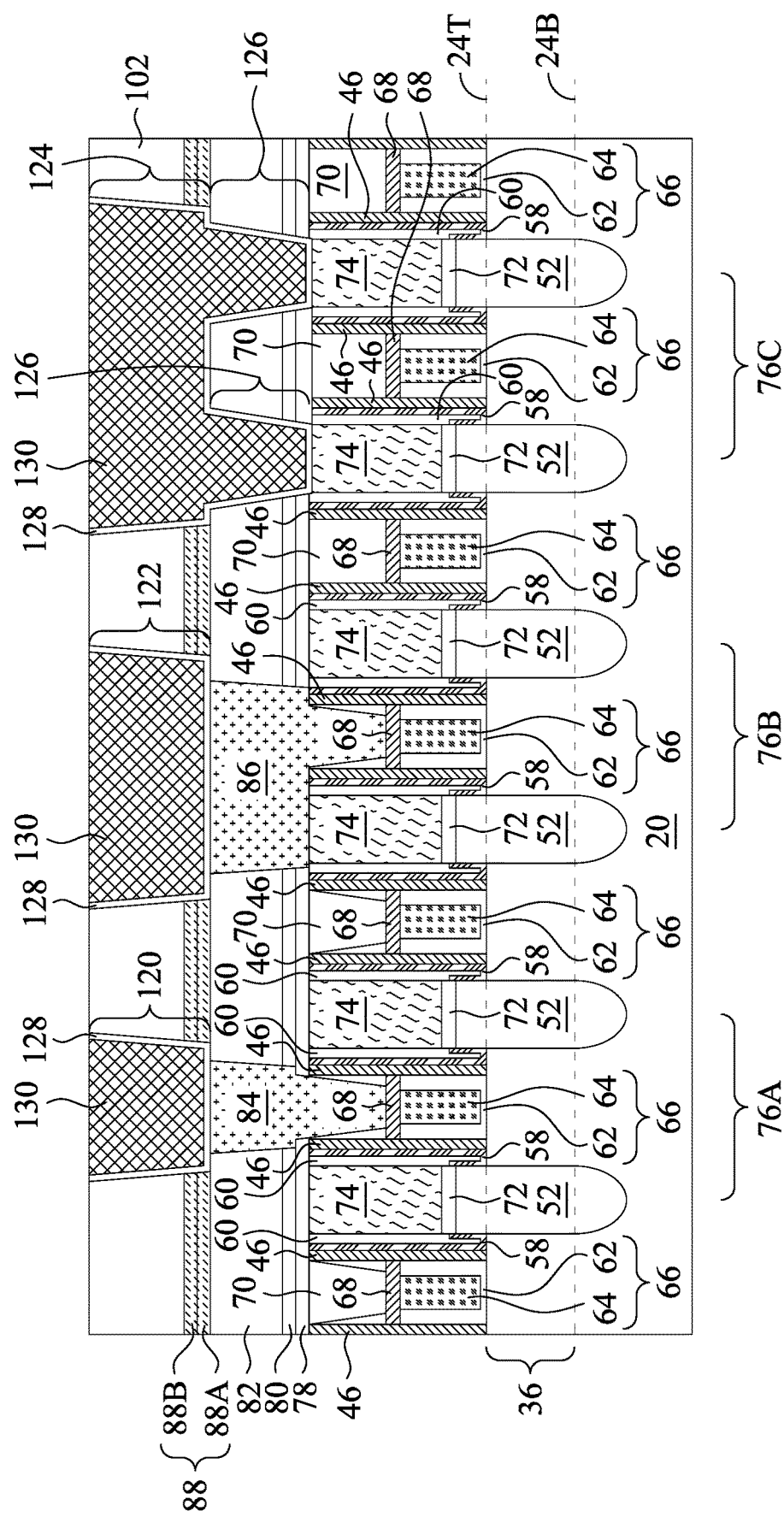
Figure 21:
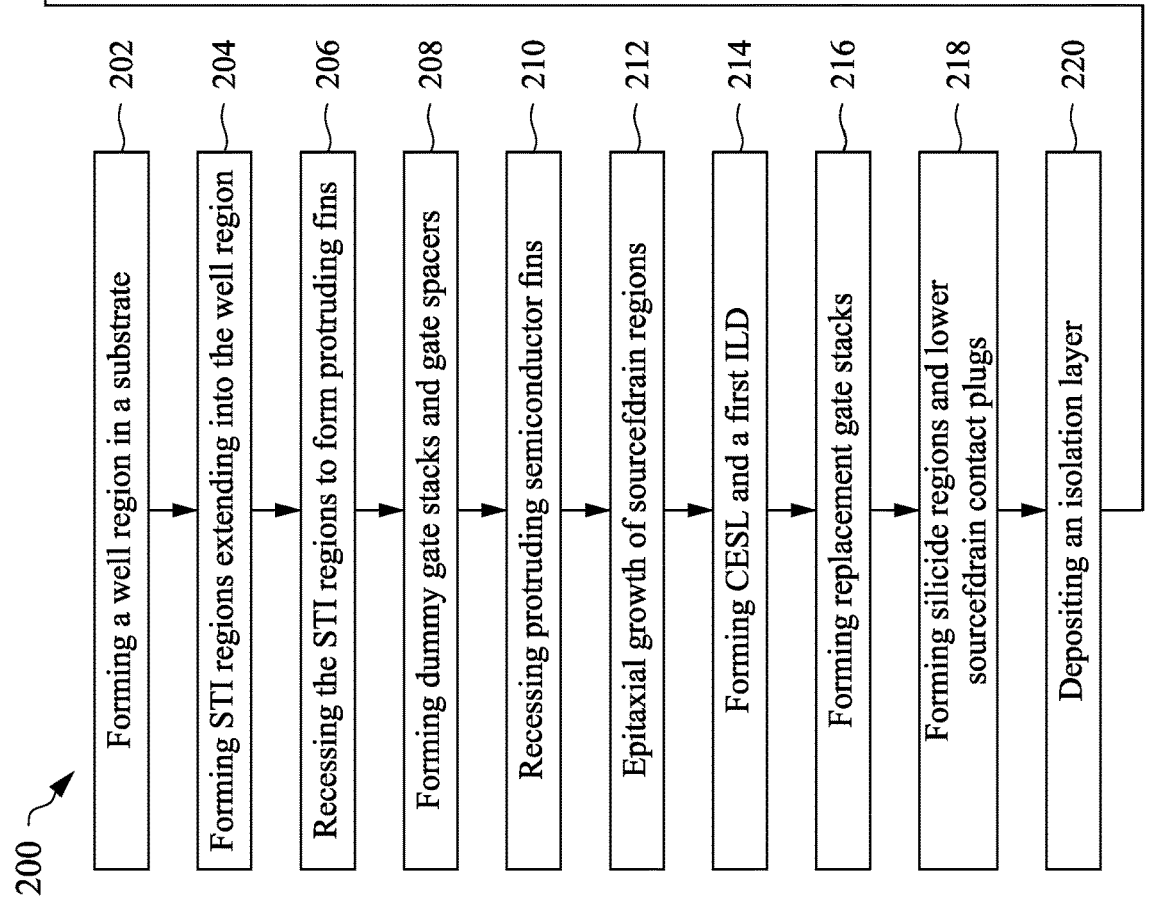
FIG. 21 illustrates a process flow in accordance with some embodiments.

Referring to FIG. 20, metal lines 120, 122, and 124 and vias 126 are formed. Metal line 124 and vias 126 form a dual damascene structure. Metal lines 120 and 122 are formed as having single damascene structures. The respective process is illustrated as process 238 in the process flow 200 as shown in FIG. 21. The formation process may include filling conductive materials into the trenches and via openings, and performing a planarization process such as a CMP process or a mechanical grinding process to remove excess conductive materials. Metal lines 120, 122, and 124 and other metal lines in the same layer are collectively referred to as a bottom metal layer, or M0. Each of metal lines 120, 122, and 124 and vias 126 may include a diffusion barrier layer 128, and a metallic material 130 over the diffusion barrier layer 128. The diffusion barrier layer 128 may be formed of or comprise titanium nitride, tantalum nitride, titanium, tantalum, or the like. The metallic material 130 may include copper, ruthenium, tungsten, cobalt, or alloys thereof.

In subsequent processes, more overlying dielectric layers and corresponding dual damascene structures are formed over the structure shown in FIG. 20. The vias of the overlying dual damascene structures may be in contact with metal lines 120, 122 and 124. The corresponding dielectric layers may be formed of low-k dielectric layers.

In the structure as shown in FIG. 20, dual damascene structures 124/126, which may include copper, is formed to contact lower contact plugs 74. The vias in the dual damascene structures may act as upper contact plugs. The vias 126 are also at the same level (in the same ILD 82) as gate contact plug 84 and butted contact 86, which are formed using a single damascene process since these features extend down deeply and have high aspect ratio, so that it is difficult to form these features in the same (dual) damascene process for forming metal lines 120 and 122. The metal lines 120 and 122 over and contacting gate contact plug 84 and butted contact 86 are formed using a single damascene process. Accordingly, the features in ILD 82 and dielectric layer 102 have mixed dual damascene and single damascene structures.

The embodiments of the present disclosure have some advantageous features. By adopting dual damascene structures, there are no interfaces formed between upper contact plugs and the overlying metal lines. Also, copper may be used to replace the otherwise higher-resistivity materials such as tungsten. Accordingly, the resistance of the dual damascene structure is lower than if single damascene structures are used. Furthermore, in the formation of the dual damascene structures, via patterns are formed before the formation of trenches. Accordingly, in the formation of via openings, there is no damage to the metal hard mask. As a comparison, if trench openings are formed first, whenever this is an overlay shift and the via patterns overlap the edges of the metal hard mask, the metal hard mask will be damaged. The embodiments of the present disclosure thus have improved process window.

In accordance with some embodiments, a method comprises forming a transistor comprising a source/drain region and a gate electrode; forming a source/drain contact plug over and electrically connecting to the source/drain region; forming a first inter-layer dielectric over the source/drain contact plug; forming an etch stop layer over the first inter-layer dielectric; etching the etch stop layer to form a first via opening; forming a second inter-layer dielectric over the first inter-layer dielectric; performing an etching process, so that the second inter-layer dielectric is etched to form a trench, and the first via opening in the etch stop layer is extended into the first inter-layer dielectric to reveal the source/drain contact plug; and filling the trench and the first via opening in common processes to form a metal line and a via, respectively.

In an embodiment, the etch stop layer comprises a lower sub-layer and an upper sub-layer over the lower sub-layer, and the method further comprises performing a first etching process to form the first via opening in the upper sub-layer, wherein the first etching process is stopped by the lower sub-layer; performing a second etching process to form a second via opening in the upper sub-layer, wherein the second etching process is stopped by the lower sub-layer; and before the etching process, performing a third etching process to extend the first via opening and the second via opening into the lower sub-layer. In an embodiment, after the metal line and the via are formed, both of the lower sub-layer and the upper sub-layer remain. In an embodiment, the lower sub-layer comprises aluminum oxide, and the upper sub-layer comprises silicon oxy-carbon-nitride. In an embodiment, the third etching process stops on the first inter-layer dielectric.

In an embodiment, the method further comprises a gate contact plug over and connecting to the gate electrode, wherein the etch stop layer is over and contacting both of the gate contact plug and the first inter-layer dielectric. In an embodiment, the gate contact plug extends into a region between gate spacers that are on opposite sides of the gate electrode. In an embodiment, the gate contact plug is a butted contact, and the butted contact is over and connecting to the gate electrode, and wherein the etch stop layer is over and contacting both of the butted contact and the first inter-layer dielectric. In an embodiment, the method further comprises, in the common processes to form the metal line and the via, forming an additional metal line over and contacting the gate contact plug. In an embodiment, the method further comprises forming a third inter-layer dielectric, wherein the source/drain contact plug is in the third inter-layer dielectric, and the forming the source/drain contact plug comprises a planarization process to level a top surface of the source/drain contact plug with a top surface of the third inter-layer dielectric.

In accordance with some embodiments, a structure comprises a transistor comprising a source/drain region and a gate electrode on a side of the source/drain region; a source/drain silicide region over and electrically connecting to the source/drain region; a source/drain contact plug over and contacting the source/drain silicide region; a gate contact plug over and connecting to the gate electrode; a first inter-layer dielectric over the source/drain contact plug; a second inter-layer dielectric over the first inter-layer dielectric; and a dual damascene structure comprising a metal line and a via underlying the metal line, wherein the via extends into the first inter-layer dielectric to be in physical contact with the source/drain contact plug, and the metal line extends into the second inter-layer dielectric.

In an embodiment, the metal line and the via are continuously connected to each other without distinguishable interface in between. In an embodiment, the gate contact plug comprises tungsten, and the dual damascene structure comprises copper. In an embodiment, the structure further comprises an etch stop layer between the first inter-layer dielectric and the second inter-layer dielectric, wherein the etch stop layer comprises a lower sub-layer and an upper sub-layer over the lower sub-layer, and wherein the metal line penetrates through the etch stop layer. In an embodiment, the lower sub-layer comprises aluminum oxide, and the upper sub-layer comprises silicon oxy carbide. In an embodiment, the structure further comprises an additional gate stack; an additional source/drain contact plug on a side of the additional gate stack; and a butted contact electrically connecting the additional gate stack to the additional source/drain contact plug.

In accordance with some embodiments, a structure comprises a transistor comprising a source/drain region and a gate electrode; a first inter-layer dielectric, wherein a part of the gate electrode is in the first inter-layer dielectric; a gate contact plug connecting to the gate electrode, wherein a portion of the gate contact plug extends lower than a top surface of the first inter-layer dielectric; a second inter-layer dielectric over the gate contact plug; a third inter-layer dielectric over the second inter-layer dielectric; and a dual damascene structure comprising a metal line and a via, wherein the metal line extends into the third inter-layer dielectric, and the via extends into the second inter-layer dielectric.

In an embodiment, the structure further comprises an etch stop layer, wherein a bottom surface of the etch stop layer physically contacts a top surface of the gate contact plug and a top surface of the second inter-layer dielectric. In an embodiment, each of the metal line and the via comprises a diffusion barrier layer and a metal region over the diffusion barrier layer, wherein the diffusion barrier layers of the metal line and the via are continuously joined to each other. In an embodiment, the gate contact plug comprises tungsten therein, and the metal line and the via comprise copper.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a transistor comprising a source/drain region and a gate electrode;
   forming a source/drain contact plug over and electrically connecting to the source/drain region;
   forming a first inter-layer dielectric over the source/drain contact plug;
   forming a gate contact plug over and connecting to the gate electrode;
   forming an etch stop layer, wherein the etch stop layer is over and contacting both of the gate contact plug and the first inter-layer dielectric;
   etching the etch stop layer to form a first via opening;
   forming a second inter-layer dielectric over the first inter-layer dielectric;
   performing an etching process, so that the second inter-layer dielectric is etched to form a trench, and the first via opening in the etch stop layer is extended into the first inter-layer dielectric to reveal the source/drain contact plug; and
   filling the trench and the first via opening in common processes to form a metal line and a via, respectively.

2. The method of claim 1, wherein the etch stop layer comprises a lower sub-layer and an upper sub-layer over the lower sub-layer, and the method further comprises:
   performing a first etching process to form the first via opening in the upper sub-layer, wherein the first etching process is stopped by the lower sub-layer;
   performing a second etching process to form a second via opening in the upper sub-layer, wherein the second etching process is stopped by the lower sub-layer; and
   before the etching process, performing a third etching process to extend the first via opening and the second via opening into the lower sub-layer.

3. The method of claim 2, wherein after the metal line and the via are formed, both of the lower sub-layer and the upper sub-layer remain.

4. The method of claim 2, wherein the lower sub-layer comprises aluminum oxide, and the upper sub-layer comprises silicon oxy-carbon-nitride.

5. The method of claim 2, wherein the third etching process stops on the first inter-layer dielectric.

6. The method of claim 1, wherein the gate contact plug extends into a region between gate spacers that are on opposite sides of the gate electrode.

7. The method of claim 1, wherein the gate contact plug is a butted contact, and the butted contact is over and connecting to the gate electrode, and wherein the etch stop layer is over and contacting both of the butted contact and the first inter-layer dielectric.

8. The method of claim 1 further comprising, in the common processes to form the metal line and the via, forming an additional metal line over and contacting the gate contact plug.

9. The method of claim 1 further comprising forming a third inter-layer dielectric, wherein the source/drain contact plug is in the third inter-layer dielectric, and the forming the source/drain contact plug comprises a planarization process to level a top surface of the source/drain contact plug with a top surface of the third inter-layer dielectric.

10. A structure comprising:
   a transistor comprising a source/drain region and a gate electrode on a side of the source/drain region;
   a source/drain silicide region over and electrically connecting to the source/drain region;
   a source/drain contact plug over and contacting the source/drain silicide region;
   a gate contact plug over and connecting to the gate electrode;
   a first inter-layer dielectric over the source/drain contact plug;
   an etch stop layer over the first inter-layer dielectric, wherein the etch stop layer comprises a lower sub-layer and an upper sub-layer over the lower sub-layer;
   a second inter-layer dielectric over the etch stop layer; and
   a dual damascene structure comprising a metal line and a via underlying the metal line, wherein the metal line penetrates through the etch stop layer, wherein the via extends into the first inter-layer dielectric to be in physical contact with the source/drain contact plug, and the metal line extends into the second inter-layer dielectric.

11. The structure of claim 10, wherein the metal line and the via are continuously connected to each other without a distinguishable interface in between.

12. The structure of claim 11, wherein the lower sub-layer comprises aluminum oxide, and the upper sub-layer comprises silicon oxy carbide.

13. The structure of claim 10, wherein the gate contact plug comprises tungsten, and the dual damascene structure comprises copper.

14. The structure of claim 10 further comprising:
an additional gate stack;
an additional source/drain contact plug on a side of the additional gate stack; and
a butted contact electrically connecting the additional gate stack to the additional source/drain contact plug.

15. A structure comprising:
a transistor comprising a source/drain region and a gate electrode;
a first inter-layer dielectric, wherein a part of the gate electrode is in the first inter-layer dielectric;
a gate contact plug connecting to the gate electrode, wherein a portion of the gate contact plug extends lower than a top surface of the first inter-layer dielectric;
a second inter-layer dielectric over the portion of the gate contact plug;
an etch stop layer over the second inter-layer dielectric, wherein the etch stop layer comprises a lower sub-layer and an upper sub-layer over the lower sub-layer;
a third inter-layer dielectric over the second inter-layer dielectric; and
a dual damascene structure comprising a metal line and a via, wherein the metal line extends into the lower sub-layer, the upper sub-layer, and the third inter-layer dielectric, and the via extends into the second inter-layer dielectric.

16. The structure of claim 15, wherein each of the metal line and the via comprises a diffusion barrier layer and a metal region over the diffusion barrier layer, wherein the diffusion barrier layers of the metal line and the via are continuously joined to each other.

17. The structure of claim 15, wherein the gate contact plug comprises tungsten therein, and the metal line and the via comprise copper.

18. The structure of claim 15, wherein a bottom surface of the metal line contacts a top surface of the second inter-layer dielectric.

19. The structure of claim 15 further comprising a first gate spacer and a second gate spacer on opposing sides of the gate electrode, wherein the gate contact plug comprises a part between, and lower than top ends of, the first gate spacer and the second gate spacer.

20. The structure of claim 19, wherein the gate contact plug is comprised in a body contact, and the structure further comprises:
a source/drain contact plug over and electrically connected to the source/drain region, wherein the body contact further contacts the source/drain contact plug.

* * * * *